(12) United States Patent  
Inoue

(10) Patent No.: US 7,405,363 B2
(45) Date of Patent: Jul. 29, 2008

(54) CONNECTING SHEET

(75) Inventor: Shuichi Inoue, Nishikamo-gun (JP)

(73) Assignee: J.S.T. Mfg. Co., Ltd., Osaka (JP)

( * ) Notice: Subject to any disclaimer, the term of this patent is extended or adjusted under 35 U.S.C. 154(b) by 120 days.

(21) Appl. No.: 10/572,556

(22) PCT Filed: Sep. 28, 2004

(86) PCT No.: PCT/JP2004/014163

§ 371 (c)(1),
(2), (4) Date: Mar. 17, 2006

(87) PCT Pub. No.: WO2005/034591

PCT Pub. Date: Apr. 14, 2005

(65) Prior Publication Data

US 2007/0000685 A1    Jan. 4, 2007

(30) Foreign Application Priority Data

Sep. 30, 2003 (JP) ............................... 2003-340186

(51) Int. Cl.
*H05K 1/03* (2006.01)

(52) U.S. Cl. ...................................... 174/255; 174/261

(58) Field of Classification Search ................ 174/255, 174/260, 261; 361/792, 793, 794, 795
See application file for complete search history.

(56) References Cited

U.S. PATENT DOCUMENTS 3,998,513 A * 12/1976 Kobayashi et al. ............ 439/91
4,201,435 A * 5/1980 Nakamura et al. ............ 439/91
6,423,909 B1 * 7/2002 Haynie et al. ................ 174/261
6,573,600 B2 * 6/2003 Kikuchi et al. ............... 257/750
6,734,370 B2 * 5/2004 Yamaguchi et al. .......... 174/260
6,743,985 B1 * 6/2004 Carrier et al. ................ 174/261
7,175,457 B2 * 2/2007 Inoue .......................... 439/260

FOREIGN PATENT DOCUMENTS

GB    1210321 A    10/1970

(Continued)

OTHER PUBLICATIONS

International Search Report.

*Primary Examiner*—Ishwar I. B. Patel
(74) *Attorney, Agent, or Firm*—Rader, Fishman & Grauer, PLLC

(57) ABSTRACT

A first high speed transmission line board (1) having a stripline structure is composed of a first elastomer sheet (1A) that has a fixed dielectric constant, plural first elastomer strips (1B) that are conductive, arrayed at two edges of the first elastomer sheet (1A), and plural first high speed transmission lines (1C) formed in a pattern connecting two ends of the first elastomer strips (1B). A first surface layer board (2) is composed of a second elastomer sheet (2A) that is nonconductive, and plural second elastomer strips (2B) that are conductive, arrayed similarly to the first elastomer strips (1B), at two edges of the second elastomer sheet (2A). A multilayer board is configured by laminating the first surface layer board (2) on the first high speed transmission line board (1), and external connecting terminals are in pressurized contact with the plural second elastomer strips (2B), so that the plural first high speed transmission lines (1C) are connected.

15 Claims, 12 Drawing Sheets

FOREIGN PATENT DOCUMENTS

| | | |
|---|---|---|
| JP | 05-093080 U | 12/1993 |
| JP | 07-106788 A | 4/1995 |
| JP | 08-046078 A | 2/1996 |
| JP | 08-242078 A | 9/1996 |
| JP | 2001-135974 A | 5/2001 |
| JP | 2002-203628 A | 7/2002 |
| JP | 2002-290055 A | 10/2002 |
| JP | 2003-069239 A | 3/2003 |
| WO | WO-98/02935 A1 | 1/1998 |

* cited by examiner

CONNECTING SHEET

TECHNICAL FIELD

The present invention relates to connecting sheets for high-speed transmission, formed from multilayer boards, used in electronic devices such as various types of audio-visual equipment and household electrical appliances, communication devices, and computers and peripherals thereof, and in particular, relates to connecting sheets in which high speed transmission lines, such as differential signal lines, or the like, are formed.

BACKGROUND ART

Printed circuit boards electrically connecting electronic components or electronic devices require functionality to realize matching of characteristic impedance, that is, an alternating electric current characteristic, to improve high speed transmission and high frequency characteristics, to reduce unnecessary emissions, and the like, as transmission signals are speeded up. Accordingly, the printed circuit boards are configured from striplines and microstrip lines, and with the increase of parallel signal lines, multilayering is necessary.

For multilayer printed circuit boards for high speed transmission, composed of striplines, various measures have, up to now, been devised for crosstalk problems, and problems of signal attenuation or reflection due to minute loads on transmission paths formed of through-hole vias.

For example, in a circuit board for high speed signals, having a multilayer structure with a signal layer and a ground (GND) layer, there is an invention that reduces reflection of signals in the vicinity of a via land, and in particular, improves transmission characteristics of high speed signals, by arranging a ground pattern so as to surround the via land in a signal layer that joins signal lines in two different layers by a via (for example, Japanese Unexamined Utility Model Application, First Publication No. Hei 5-93080, referred to below as Patent Document 1).

Furthermore, as a printed circuit board having a multilayer wiring structure suitable for high speed signal transmission, including geometrically shaped forms for signal wiring and power source/ground system conductors, an invention composed of a multilayer printed circuit board is disclosed, having an electrical potential supply system layer, formed of plural parallel strip conductors each given a prescribed electrical potential, and a signal wiring layer configured by laminating the electrical potential supply system layer separated by an insulating layer, with wiring parallel to the parallel strip conductors (for example, Japanese Unexamined Patent Application, First Publication No. Hei 8-46078, referred to below as Patent Document 2).

In the abovementioned Patent Document 2, if the conductor width in a pattern of the parallel strip conductors is less than or equal to twice the signal wiring, and the pattern pitch is less than or equal to three times the signal wiring width, an optimal pattern can be obtained with minimal propagation delay and little waveform distortion.

In addition, as a printed circuit board in which crosstalk between signal lines and signal interference is reduced, with plural paths with fixed impedance arrayed on the printed circuit board, an invention composed of a multilayer printed circuit board is disclosed, being provided with a ground pattern area arranged between each adjacent line, and a via hole arranged in the ground pattern area, so as to conduct electricity to this ground pattern area and other ground pattern areas, each adjacent line being shielded (for example, Japanese Unexamined Patent Application, First Publication No. Hei 8-242078, referred to below as Patent Document 3).

Similar to the abovementioned Patent Document 3, as a circuit board for a high frequency circuit in which high frequency wiring is easy, and unnecessary electromagnetic coupling between transmission paths is reduced, in a multilayer circuit board for a high frequency circuit with stripline configuration transmission paths, including plural layers with signal layers between two grounded conducting layers, an invention is disclosed composed of the multilayer circuit board for a high frequency circuit in which signal lines and ground lines are laid out alternately in the signal layer, and the signal lines and the ground lines are laid out opposite each other, in adjacent signal layers, the ground lines having a width that is wider than the signal lines opposite (for example, Japanese Unexamined Patent Application, First Publication No. 2003-69239, referred to below as Patent Document 4).

In the abovementioned Patent Document 4, the effect of crosstalk between the signal lines and of electromagnetic noise from outside can be restrained and high density wiring can be realized. In addition, by providing a microstripline structure in an outer region, signal lines for passing signals and the like, with little crosstalk, can be provided. Furthermore, a stripline structure that does not have internal ground lines can be configured, and signals with little crosstalk can be passed in signal lines in the internal stripline structure.

Additionally, as a flexible board, an invention is disclosed composed of a flat shielded cable, having an insulating layer, formed from a liquid crystal polymer and integrally folded in two, signal wiring and ground wiring insulated and separated on mutually opposing faces of the insulating layer, that is folded (for example, folded in two) and arrayed integrally, a shield layer, integrally disposed on an external face of the insulating layer, for covering a region in which the signal wiring and the ground wiring are laid out, and an electrical conductor, passing through the insulating layer, for electrically connecting the ground wiring and the shield layer (for example, Japanese Unexamined Patent Application, First Publication No. 2001-135974, referred to below as Patent Document 5).

In the abovementioned Patent Document 5, by electrically connecting the shield layer and the ground wiring, with respect to the signal wiring, and in addition by the folding of the integrated shield layer, required sealing is realized. That is, the liquid crystal polymer that forms the insulating layer has good high frequency characteristics with a low dielectric constant, and exhibits stable functionality with little hygroscopicity, and together with characteristics that do not require high level machining accuracy, a flexible flat shielded cable with high reliability and low cost can be provided, so that it is possible to realize enhanced performance with the high frequency signal circuit.

Furthermore, as a flexible multilayer circuit board, an invention composed of a multilayer circuit board is disclosed in which the multilayer circuit board, formed of an organic material, built by laminating plural insulating layers in which wiring conductors, formed of metal foil, are arranged on at least one of the upper and lower surfaces, electrically connects the wiring conductors that sandwich, by being positioned above and below, the insulating layers, by a penetrating conductor formed in the insulating layers, the insulating layers being formed of a covering layer made of polyphenylene ether based organic matter on the upper and lower surfaces of a liquid crystal polymer layer, the liquid crystal polymer layer having an anisotropic dielectric property in which its dielectric constant is greatest in one direction among the directions parallel to its surface, and with a dielectric constant epsilon-X in the direction in which the dielectric constant is greatest, among directions parallel to the surface of the liquid crystal polymer layer, and with a dielectric constant epsilon-Y in a direction orthogonal to the direction in which the dielectric constant is greatest, among the directions parallel to the surface of the liquid crystal polymer layer, an anisotropic dielectric property degree, expressed as the ratio, epsilon-X/epsilon-Y, is between 1.2 and 2.0, (for example, Japanese Unexamined Patent Application, First Publication No. 2002-290055, referred to below as Patent Document 6).

In the abovementioned Patent Document 6, the insulating layer is formed of the covering layer made of the polyphenylene ether type organic matter on the surface of the liquid crystal polymer layer, so that minute through-holes can be provided by boring; as a result, the multilayer circuit board having high density wiring is possible, and in addition, the dielectric constants of the liquid crystal polymer layer and the covering layer formed from the polyphenylene ether based organic matter are low in a high frequency region, so that the multilayer circuit board with excellent transmission characteristics in the high frequency region is possible.

DISCLOSURE OF THE INVENTION

Problems to be Solved by the Invention

However, although Patent Document 1 promises the effect of reducing signal reflection on a surface in the vicinity of the via land, there is a problem, for example, in that signal reflection occurs in a vertical direction, with a method in which wiring is connected by a via, or the like, that vertically penetrates plural boards. In addition, there is a problem in that equivalence cannot be obtained, in the vertical direction, in a connection by a via.

Patent Document 2 describes a multilayer printed circuit board having a unique strip structure in which the power source/ground system conductors form the parallel strip conductors; in a power source/ground system layer it is clear that the continuous surface pattern in the signal wiring direction, which does not have an opening or discontinuous portions, is good, but there is a problem about whether processing technology is adequate for the insulating layer and the power source/ground system layer.

According to Patent Document 3, the via hole is arranged so as to conduct electricity along the various adjacent paths to the ground pattern area and other ground pattern areas; since each adjacent path is shielded, a three dimensional shield can be implemented for each adjacent path, and in this way, crosstalk and signal interference between the various paths can be reduced, but the via holes shield in a cylindrical shape arranged at intervals, so that a complete shielding wall cannot be implemented.

In Patent Document 4, by laying out the signal lines and the ground lines alternately in the signal layer, crosstalk can be prevented. In particular, by enlarging the width of the ground line, the intention is to approach a stripline structure and reduce effects of crosstalk between layers. In Patent Document 4, by laying out the signal lines and the ground lines alternately in the signal layer, the effects of crosstalk can be reduced.

However, with higher speed signals, by merely disposing ground lines on the surface as disclosed in Patent Document 3 and Patent Document 4, the effects of crosstalk cannot be reduced. If the distance between signals is increased in order to reduce the effects of crosstalk, packaging density decreases, yielding an inefficient structure. To be able to further reduce the effects of crosstalk while maintaining packaging density, a new structure is required for a multilayer board for high speed transmission.

Also in Patent Document 5 and Patent Document 6, there are problems in that signal reflection occurs in a vertical direction due to the formation of the via that vertically penetrates the plural boards, and in that a more secure shield structure is required for crosstalk measures.

FIG. 12 is a perspective view showing a state in which external connecting terminals 31 are connected to a conventional multilayer printed circuit board 40. As shown in the conventional technology of FIG. 12, the plural external connecting terminals 31, which have spring characteristics, press upon line terminals 41 that are edge connectors formed on a surface layer of the multilayer printed circuit board 40.

In FIG. 12, since the line terminals 41 and the external connecting terminals 31 slide relative to each other, a space is necessary around a curved contact portion provided at the extremity of each of the external connecting terminals 31. The air (atmospheric air) that exists in this space is the most effective constituent from the viewpoint of capacitance. In the conventional external connecting structure shown in FIG. 12, since the contact portion is a point contact or a line contact, the existence of the air cannot be neglected. Thus, so that the air does not get in, an external connecting structure is required that has close surface contact with the line terminals 41.

Furthermore, in FIG. 12, at the extremity below the contact portion in the external connecting terminals 31, there exists a "rebounding portion" at which an electrical signal proceeding in the direction of a solid line arrow in the figure is reflected in the direction of the dashed line arrow, and this rebounding portion forms an open circuit in the electrical circuit, so that consumption of signal energy is halted. This occurrence of almost 100% reflection must be eliminated.

In addition, the external connecting terminals 31 are, for example, connected to a via 42, and this via 42 forms a through-hole via 43, so that connectivity is provided for signals in an inner layer or an outer layer of the multilayer printed circuit board 40. This through-hole via 43 also forms an open circuit in the electrical circuit, and rebounding of electrical signals occurs.

Manufacturing cost of the via is generally high, and, for example, as shown in Patent Document 3, if many vias are formed, the manufacturing cost of one multilayer printed circuit board increases. As a result, a connecting structure between multiple layers, instead of vias, is required for multilayer printed circuit boards. In particular, in high frequency signal areas in which data transmission speed of 1 Gbit/second or greater is required, an innovation is needed that prevents signal deterioration due to dielectric loss or reflection in high speed transmission paths.

In order to solve the abovementioned problems, the present invention has as a first object the provision of a connecting sheet for high speed transmission, having a structure for external connection that reduces reflection of high speed signals. Furthermore, a second object of the present invention is the provision of a connecting sheet for high speed transmission, having a more secure shielding structure in order to prevent crosstalk between high speed signals. In addition, a third object of the present invention is the provision of a connecting sheet for high speed transmission, having a new connecting structure between multiple layers, instead of vias, in multilayer printed circuit boards.

MEANS FOR SOLVING THE PROBLEMS

In order to realize the abovementioned objects, the inventor has invented the connecting sheet for high speed transmission, as described below.

In a first aspect of the present invention, a connecting sheet includes a multilayer board composed of plural boards that are laminated, for a pair of external connecting terminals being in pressurized contact with two edges of the multilayer board, and the multilayer board is provided with: a first high speed transmission line board having a stripline structure that includes a first elastomer sheet that has a fixed dielectric constant, plural first elastomer strips arrayed at two edges of the first elastomer sheet, that are electrically conductive between front and back surfaces, and plural first high speed transmission lines connecting two ends of the plural first elastomer strips and being formed in a pattern on the first elastomer sheet, and a first surface layer board that includes a second elastomer sheet that is nonconductive, and plural second elastomer strips arrayed at edges of the second elastomer sheet, that are electrically conductive between front and back surfaces.

In a second aspect of the connecting sheet as described in the first aspect of the present invention, the multilayer board is configured by the first surface layer board being laminated on the first high speed transmission line board, the plural second elastomer strips are arrayed in association with the first elastomer strips, at two edges of the second elastomer sheet, on the first surface layer board, the external connecting terminals are in pressurized contact with the plural second elastomer strips formed at two edges of the first surface layer board, and the external connecting terminals and the plural first high speed transmission lines are connected.

In a third aspect of the connecting sheet as described in the first aspect of the present invention, the multilayer board further includes a second surface layer board that has a third elastomer sheet that is nonconductive, and plural third elastomer strips arrayed in association with the first elastomer strips, at one edge of the third elastomer sheet, being electrically conductive between front and back surfaces; the multilayer board is configured with the first high speed transmission line board as a core board, and the first surface layer board and the second surface layer board are laminated opposing each other; on the first surface layer board the second elastomer strips are arrayed in association with the first elastomer strips, at one edge of the second elastomer sheet; the second elastomer strips and the plural third elastomer strips are positioned at two edges of the multilayer board; one of the pair of external connecting terminals is in pressurized contact with the second elastomer strips formed at one edge of the first surface layer board, the other of the external connecting terminals is in pressurized contact with the third elastomer strips formed at the other edge of the second surface layer board, and the external connecting terminals and the plural first high speed transmission lines are connected.

In a fourth aspect of the connecting sheet as described in the first aspect of the present invention, the multilayer board further includes a second surface layer board, a first inner layer board, and a first and a second ground board; on the first surface layer board the plural second elastomer strips are arrayed in association with the first elastomer strips, at two edges of the second elastomer sheet; the second surface layer board has a third elastomer sheet that is nonconductive, and plural third elastomer strips arrayed in association with the first elastomer strips, at edges of the third elastomer sheet, that are electrically conductive between front and back surfaces; the first high speed transmission line board further includes a first elastomer that forms plural ground layers, arrayed in parallel to the first high speed transmission lines so as to sandwich the first high speed transmission lines, being electrically conductive between front and back surfaces; the first inner layer board includes a fourth elastomer sheet that is nonconductive, plural fourth elastomer strips arrayed in association with the first elastomer strips, at two edges of the fourth elastomer sheet, being electrically conductive between front and back surfaces, and a second elastomer forming plural ground layers, arrayed in association with the first elastomer, being electrically conductive between front and back surfaces; the ground boards have at least a width in contact with the first elastomer, and the first ground board, the first high speed transmission line board, the first inner layer board, and the second ground board are laminated, in that order, to form an offset stripline structure; the first surface layer board is additionally laminated on the offset stripline structure to form the multilayer board; and by the surfaces of the multilayer board being pressed together, an electromagnetic shielding wall is formed between the plural first high speed transmission lines.

In a fifth aspect of the connecting sheet as described in the fourth aspect of the present invention, the electromagnetic shielding wall between the plural first high speed transmission lines is formed by respectively joining, with electrically conductive adhesive, the first ground board and the first elastomer on the first high speed transmission line board, the first elastomer and the second elastomer on the first inner layer board, and the second elastomer and the ground board.

In a sixth aspect of the connecting sheet as described in the third aspect of the present invention, the multilayer board further includes a first inner layer board and a first and a second ground board; the first high speed board further includes a first elastomer forming plural ground layers, arrayed in parallel to the first high speed transmission lines so as to sandwich the first high speed transmission lines, being electrically conductive between front and back surfaces;

the first inner layer board has a fourth elastomer sheet that is nonconductive, plural fourth elastomer strips arrayed in association with the first elastomer strips at two edges of the fourth elastomer sheet and being electrically conductive between front and back surfaces, and a second elastomer forming plural ground layers arrayed in association with the first elastomer and being electrically conductive between front and back surfaces; the first and the second ground boards have at least a width in contact with the first elastomer; the first ground board, the first high speed transmission line board, the first inner layer board, and the second ground board are laminated, in that order, to form an offset stripline structure; on two surfaces of the offset stripline structure the first surface layer board and the second surface layer board are additionally laminated to form the multilayer board; and by the surfaces of the multilayer board being pressed together, an electromagnetic shielding wall is formed between the plural first high speed transmission lines.

In a seventh aspect of the connecting sheet as described in the sixth aspect of the present invention, the electromagnetic shielding wall between the plural first high speed transmission lines is formed by respectively joining, with electrically conductive adhesive, the first ground board and the first elastomer on the first high speed transmission line board, the first elastomer and the second elastomer on the first inner layer board, and the second elastomer and the second ground board.

In an eighth aspect of the connecting sheet as described in the fourth or fifth aspects of the present invention, the multilayer board further includes a second high speed transmission line board having a stripline structure, a second inner layer board, and a third ground board; first elastomer strip pairs, formed of two of the first elastomer strips on the first high speed transmission line board, are arrayed at regular intervals at two edges of the first elastomer sheet, the first high speed transmission lines are connected at regular intervals alternately with the first elastomer strip pairs, between two ends of the first elastomer strips, the third elastomer strips of the second surface layer board are arrayed in association with the first elastomer strips, at one edge of the third elastomer sheet; the second high speed transmission line board includes a fifth elastomer sheet that has a fixed dielectric constant, plural fifth elastomer strips arrayed at intervals overlapping the first elastomer strips, at two edges of the fifth elastomer sheet, and being electrically conductive between front and back surfaces, plural second high speed transmission lines formed in a pattern on the fifth elastomer sheet and connecting two ends of the plural fifth elastomer strips so as to alternate with the first high speed transmission lines, and a third elastomer forming plural ground layers, arrayed in parallel to the second high speed transmission lines so as to sandwich the second high speed transmission lines, and being electrically conductive between front and back surfaces; the second inner layer board includes a sixth elastomer sheet that is nonconductive, plural sixth elastomer strips arrayed in association with the fifth elastomer strips, at two edges of the sixth elastomer sheet, and being electrically conductive between front and back surfaces, and a fourth elastomer forming plural ground layers arrayed in association with the third elastomer and being electrically conductive between front and back surfaces; the second surface layer board, the third ground board, the second high speed transmission line board, the second inner layer board, the first ground board, the first high speed transmission line board, the first inner layer board, the second ground board, and the first surface layer board are laminated, in that order, to form the multilayer board having a two-layer offset stripline structure, the external connecting terminals are in pressurized contact with the plural second elastomer strips formed at two edges of the first surface layer board in the multilayer board, and the external connecting terminals are connected with the plural first high speed transmission lines and the plural second high speed transmission lines.

In a ninth aspect of the connecting sheet as described in the eighth aspect of the present invention, one of the pair of external connecting terminals is in pressurized contact with the plural second elastomer strips formed at one edge of the first surface layer board in the multilayer board, the other of the external connecting terminals is in pressurized contact with the plural third elastomer strips formed at the other edge of the second surface layer board in the multilayer board, and the external connecting terminals are connected with the plural first high speed transmission lines and the plural second high speed transmission lines.

In a tenth aspect of the connecting sheet as described in the eighth or ninth aspects of the present invention, the electromagnetic shielding wall between the plural second high speed transmission lines is formed by respectively joining, with electrically conductive adhesive, the third ground board and the third elastomer on the second high speed transmission line board, the third elastomer and the fourth elastomer on the second inner layer board, and the fourth elastomer and first ground board.

In an eleventh aspect of the connecting sheet as described in the first aspect of the present invention, the multilayer board is further provided with: a second high speed transmission line board having a stripline structure, a first inner layer board, a second inner layer board, a third inner layer board, first, second, third, and fourth ground boards, and a bottom sheet; the first high speed transmission line board further includes a first elastomer forming plural ground layers arrayed in parallel to the first high speed transmission lines so as to sandwich the first high speed transmission lines, that are conductive between front and back surfaces; the first high speed transmission lines connect, as desired, two ends of the first elastomer strips; on the first surface layer board the second elastomer strips are arrayed in association with the first elastomer strips, at two edges of the second elastomer sheet; the second high speed transmission line board includes a fifth elastomer sheet that has a fixed dielectric constant, plural fifth elastomer strips arrayed at two edges of the fifth elastomer sheet, that are conductive between front and back surfaces, plural second high speed transmission lines connecting, as desired, two ends of the plural fifth elastomer strips, and formed as a pattern on the fifth elastomer sheet, and a second elastomer forming plural ground layers arrayed in parallel to the second high speed transmission lines so as to sandwich the second high speed transmission lines, being conductive between front and back surfaces; the first inner layer board includes a fourth elastomer sheet that is nonconductive, plural fourth elastomer strips arrayed in association with the first elastomers strips, at two edges of the fourth elastomer sheet, being conductive between front and back surfaces, and a third elastomer forming plural ground layers arrayed in association with the first elastomer, being conductive between front and back surfaces; the second inner layer board includes a sixth elastomer sheet 1 that is nonconductive, plural sixth elastomer strips arrayed in association with the fifth elastomer strips, at two edges of the sixth elastomer sheet, being conductive between front and back surfaces, and a fourth elastomer forming plural ground layers arrayed in association with the second elastomer, being conductive between front and back surfaces; the third inner layer board includes a seventh elastomer that is nonconductive, and plural seventh elastomer strips arrayed in association with the fifth elastomer strips, at two edges of the seventh elastomer sheet, being conductive between front and back surfaces; the first, second, third, and fourth ground boards having at least a width in contact with the first elastomer and the second elastomer; the bottom sheet, the fourth ground board, the second high speed transmission line board, the third inner layer board, the third ground board, the second inner layer board, the first ground board, the first high speed transmission line board, the first inner layer board, the second ground board, and the first surface layer board being laminated, in that order, to form the multilayer board that has a two-layer offset stripline structure; and the plural first high speed transmission lines and the plural second high speed transmission lines intersect three dimensionally in the multilayer board.

In a twelfth aspect of the connecting sheet as described in the eleventh aspect of the present invention, the external connecting terminals are in pressurized contact with the plural second elastomer strips formed at two edges of the first surface layer board in the multilayer board, and the external connecting terminals are connected to the plural first high speed transmission lines and the plural second high speed transmission lines.

In a thirteenth aspect of the connecting sheet as described in any of the first through the twelfth aspects of the present invention, the high speed transmission lines include differential signal lines that form a pair.

An "elastomer sheet" may be a flexible sheet having a prescribed thickness and having a prescribed front surface and back surface on the front and back of this thickness. Regarding "having a prescribed thickness and having a prescribed front surface and back surface on the front and back of this thickness", characteristics of a normal sheet are adequate. The elastomer sheet has a certain thickness, and the front surface and the back surface prescribed with dimensions larger than the thickness, may approximate the thickness. "Flexibility" means that the sheets can bend.

"Elastomer strips" means members that are flexible in the direction of thickness of the sheet and that have an elongated shape. Elongated means that the ratio of length to width preferably exceeds 1, and more preferably, exceeds 10.

An "elastomer sheet having a fixed dielectric constant" is a dielectric body for forming a stripline structure, elastomer raw material may include a substance having a fixed relative dielectric constant; for example, it may have a dielectric constant equal to that of a Teflon (registered trademark) board for a hard printed circuit board.

In the first high speed transmission line board, plural first elastomer strips that are conductive between front and back surfaces may be arrayed corresponding to the pitch of the external connecting terminals at two edges of the first elastomer sheet that has a fixed dielectric constant. Moreover, plural first elastomer strips corresponding to the pitch of the first high speed transmission lines may be arrayed at two edges of the first elastomer sheet that has a fixed dielectric constant. Accordingly, at the edges of the first elastomer sheet, the first elastomer strips are arrayed with the first elastomer sheet, to form an anisotropic conductive sheet.

In setting out the first elastomer strips, that are conductive, with the first elastomer sheet that has the fixed dielectric constant, reciprocal chemical joining may be used to make the anisotropic conductive sheet. In order to realize this type of joining, a coupling agent may be used between the members. As a bonding agent for joining these members, this type of coupling agent may include normal commercially available adhesive. Specifically, the coupling agent may be silane based, aluminum based, titanate based, or the like, and a silane coupling agent may satisfactorily be used.

Furthermore, in the present specification, "arrayed at two edges" means being disposed at two edge locations. Accordingly, "two edges" may be taken to mean a pair of edge areas parallel to each other on the elastomer sheet that has a rectangular shape, or may be taken to mean a pair of edge areas forming two sides orthogonal to each other. In a preferred embodiment, the plural first elastomer strips that are electrically conductive may be arrayed at two opposing edges of the first elastomer sheet that has a rectangular shape. Furthermore, as another preferable embodiment, the first elastomer strips that are electrically conductive may be arrayed at two edges that form two adjacent mutually orthogonal sides on the first elastomer sheet that has a rectangular shape. In addition, the first elastomer strips that are electrically conductive may be arrayed in a radial form at opposing edges (peripheral areas) on the first elastomer sheet that has a circular shape, or the first elastomer strips that are electrically conductive may be arrayed in a radial form at adjacent peripheral areas.

After copper foil is laminated and disposed on one face of the first elastomer sheet on which the plural first elastomer strips are arrayed at two edges, high speed transmission lines are formed in a pattern by a print etching method, on the first high speed transmission line board. This first high speed transmission line board has a stripline structure, with copper foil plating laminated to form ground layers facing the high speed transmission lines.

The first high speed transmission line board has the plural first elastomer strips that form edge connectors at two edges, these plural first elastomer strips are connected, for example, in a pattern by paired differential signal lines, and the overall high speed transmission line board may be flexible in the direction of thickness.

Regarding an "elastomer sheet that is nonconductive", the elastomer sheet may be considered to be nonconductive, nonconductive meaning that conductivity is sufficiently low, and that electrical resistance is sufficiently high. In addition, this means that the elastomer sheet that is nonconductive as a whole is nonconductive such that it has sufficient nonconductivity in a nonconductive direction.

The "elastomer sheet that is nonconductive" is a sheet member formed of normal elastomer raw material. Normal elastomer raw material is generally nonconductive; specifically, butadiene copolymer, conjugated diene-based rubber and such hydrogenated substances, block copolymer rubber and such hydrogenated substances, chloroprene polymer, vinyl chloride vinyl acetate copolymer, urethane rubber, polyester-based rubber, epichlorohydrin rubber, ethylene propylene copolymer rubber, ethylene propylene diene copolymer rubber, flexible liquid epoxy rubber, silicone rubber, fluoro-rubber, or the like, are used. As the butadiene copolymer or conjugated diene-based rubber, butadiene styrene, butadiene acrylonitrile, butadiene isobutylene, and the like, may be cited, and as the block copolymer rubber, styrene butadiene diene block copolymer rubber, styrene isoprene block copolymer, or the like, may be cited.

Among these, silicone rubber, which has excellent thermal resistance, low-temperature resistance, chemical resistance, weather resistance, electrical insulation, and safety characteristics, is preferably used. Since volume resistivity of this type of nonconductive elastomer sheet is normally high (for example, 1 megohm-centimeters or greater, at 100 V), it is nonconductive.

Regarding "elastomer strips that are conductive" the elastomer sheet may be considered as having electrical conductivity, with the conductivity being sufficiently high. In addition, electrical resistance is sufficiently low. Furthermore, this means that the elastomer strips as a whole have conductivity in that they can be made sufficiently conductive in a conductive direction of an elastomer having this configuration.

Normally, in order to make the volume resistivity of the elastomer, that is conductive, low (for example, 1 ohm-centimeter or less), the elastomer may be obtained by mixing a conductive material in elastomer raw material that is not conductive. As elastomer raw material that does not conduct electricity, specifically, the abovementioned normal elastomer raw material is appropriate.

Among these normal elastomers, silicone rubber, which has excellent thermal resistance, low-temperature resistance, chemical resistance, weather resistance, electrical insulation, and safety characteristics, is preferably used. As a conductive material, pure metal, alloy, or nonmetal powder (flake, shreds, foil are also possible) may be mixed with this type of elastomer raw material. As a pure metal, gold, silver, copper, nickel, tungsten, platinum, and palladium may be cited, and as an alloy, stainless steel (SUS grade), phosphor bronze, beryllium copper, and the like, may be cited. As nonmetal conductive material, carbon may be cited, and the carbon may include carbon nanotubes, fullerenes, or the like.

In setting out the elastomer strips that are conductive, on the nonconductive elastomer sheet, to make an anisotropic conductive sheet, reciprocal chemical joining may be used. In order to realize this type of joining, a coupling agent may be used between members. As a bonding agent for joining these members, this type of coupling agent may include normal commercially available adhesive. Specifically, the coupling agent may be silane based, aluminum based, titanate based, or the like, and a silane coupling agent may satisfactorily be used.

So that the plural first elastomer strips and the plural second elastomer strips make contact, one to one, and allow conduction, the first surface layer board is laminated and bonded to the first high speed transmission line board to form the multilayer board, and the external connecting terminals are in pressurized contact with the plural second elastomer strips formed at the edges of the first surface layer board, so that the external connecting terminals and the plural first high speed transmission lines are connected.

In the connecting sheet having this type of external connecting structure, since surface contact is made so that the external connecting terminals are firmly attached to the plural elastomer strips that are conductive and form the edge connectors, there is no air layer between the external connecting terminals and the edge connectors, and reflection of high speed signals at connecting ends of the external connecting terminals does not easily occur.

In the connecting sheet having this type of inter-layer connecting structure, solely by pressing members together, without a via being provided, the high speed transmission lines can be connected in a pattern formed on the surface layer of the board. In addition, if an insulating sheet is laminated on the lower face of the high speed transmission line board, since a via penetrating in the direction of thickness of the board, as was done conventionally, is not provided, there is an advantage in that signal reflection in the direction of thickness of the board does not easily occur.

In the connecting sheet as described in the third aspect of the present invention, on the first surface layer board, the plural second elastomer strips that are conductive are arrayed with the second elastomer sheet, at one edge of the second elastomer sheet, that is nonconductive, to form the anisotropic conductive sheet. In other words, at one edge of the first surface layer board, formed of the second elastomer sheet that is nonconductive, the second elastomer sheet and the second elastomer strips are alternately arrayed to form an anisotropic conductive sheet. This anisotropic conductive sheet, formed at one edge, functions as an edge connector to which one of the external connecting terminals is electrically connected.

On the other hand, in the second surface layer board, the plural third elastomer strips that are conductive are arrayed at the other edge of the third elastomer sheet that is nonconductive, to form an anisotropic conductive sheet. In other words, on the second surface layer board formed with the third elastomer sheet that is nonconductive, the third elastomer sheet and the second elastomer strips are alternately arrayed at the other edge, to form the anisotropic conductive sheet. This anisotropic conductive sheet, formed on the other edge, functions as an edge connector to which the other external connecting terminal is electrically connected.

As a preferable embodiment, the plural second elastomer strips that are conductive may be arrayed at one edge, among two opposing edges, of the second elastomer sheet that has a rectangular shape, and the plural third elastomer strips that are conductive may be arrayed at the other edge opposing the one edge, among the two opposing edges, of the third elastomer sheet that has the rectangular shape. Furthermore, as another preferable embodiment, the second elastomer strips that are conductive may be arrayed at one edge of two edges that form two mutually orthogonal sides on the second elastomer sheet that has a rectangular shape, and the third elastomer strips that are conductive may be arrayed at the other edge on the third elastomer sheet that has a rectangular shape.

Regarding the connecting sheet for high speed transmission, formed of the multilayer board laminated from, in order, the second surface layer board, the first high speed transmission line board, and the first surface layer board, if one of the external connecting terminals is in pressurized contact with one edge of the first surface layer board, and the other of the external connecting terminals is in pressurized contact with an edge at the other side of the second surface layer board, the external connecting terminals and the plural first high speed transmission lines are connected through one of the external connecting terminals, the second elastomer strips, the first elastomer strips, the first high speed transmission lines, the first elastomer strips, the third elastomer strips, and the other of the external connecting terminals.

In the connecting sheet having this type of external connecting structure, since surface contact is performed so that the external connecting terminals are firmly attached to the plural elastomer strips that are conductive and form the edge connectors, there is no air layer between the external connecting terminals and the edge connectors, and reflection of high speed signals at connecting ends of the external connecting terminals does not easily occur.

In the connecting sheet having this type of inter-layer connecting structure, without providing a via, by solely pressing the one of the external connecting terminals disposed on the front layer and the other of the external connecting terminals disposed on the back layer, onto the anisotropic conductive sheet on which the conductive elastomer and the nonconductive elastomer are alternately arrayed, the high speed transmission lines can be connected in three dimensions.

According to the fourth aspect of the present invention, the plural fourth elastomer strips that are conductive are arrayed at two edges of the fourth elastomer sheet that is nonconductive, to form an anisotropic conductive sheet. In other words, the fourth elastomer strips are arrayed alternately with the fourth elastomer sheet at two edges of the fourth layer board formed of the fourth elastomer sheet that is nonconductive, to form the anisotropic conductive sheet. The anisotropic conductive sheet formed at the two edges of this first inner layer board functions as an edge connector electrically connecting the first elastomer strips on the first high speed transmission line board and the second elastomer strips on the first surface layer board.

In addition, in the first high speed transmission line board, the first elastomer sheet that has a fixed dielectric constant and the first elastomer that forms the conductive ground layers are alternately arrayed, to form an anisotropic conductive sheet. The first elastomer sheet and the first elastomer are arrayed alternately and contiguously in a longitudinal direction (a direction linking two ends of the first elastomer strips).

On the other hand, in the first inner layer board, the fourth elastomer sheet that is nonconductive and the second elastomer that forms the conductive ground layers are alternately arrayed, to form an anisotropic conductive sheet. The fourth elastomer sheet and the second elastomer are arrayed alternately and contiguously in a longitudinal direction (a direction linking two ends of the fourth elastomer strips).

By the faces of the connecting sheet formed of the multilayer board being pressed together, the first elastomer and the second elastomer form an electromagnetic shielding wall that completely separates the first high speed transmission lines. Moreover, the first elastomer and the second elastomer are each in conductive contact with the ground layers, so that each of the high speed transmission lines is electromagnetically shielded in three dimensions as if framed by a quadrangular prism-shaped pipe.

In this type of connecting sheet, since the high speed transmission lines are electromagnetically shielded in three dimensions as if framed by the ground board and an elastomer that is conductive, crosstalk between the high speed transmission lines can assuredly be prevented.

In the connecting sheet, in which the high speed transmission lines are electromagnetically shielded in three dimensions as if framed, by the ground board and the elastomer that is conductive, as described in the fifth aspect of the present invention, the elastomer between the multiple layers, that forms the ground layers, and the elastomer and the ground board may each be joined in advance by electrically conductive adhesive.

In the first surface layer board of the connecting sheet for high speed transmission as described in the sixth aspect of the present invention, the plural second elastomer strips that are conductive are arrayed at one edge of the second elastomer sheet that is nonconductive, to form an anisotropic conductive sheet. In other words, at one edge of the first surface layer board, formed of the second elastomer sheet that is nonconductive, the second elastomer sheet and the second elastomer strips are alternately arrayed to form the anisotropic conductive sheet. This anisotropic conductive sheet, formed at one edge, functions as an edge connector to which one of the external connecting terminals is electrically connected.

On the other hand, in the second surface layer board, the plural third elastomer strips that are conductive are arrayed at the other edge of the third elastomer sheet that is nonconductive, to form the anisotropic conductive sheet. In other words, on the second surface layer board formed of the third elastomer sheet that is nonconductive, the third elastomer sheet and the second elastomer strips are alternately arrayed at the other edge, to form the anisotropic conductive sheet. This anisotropic conductive sheet formed at the other edge functions as an edge connector to which the other external connecting terminal is electrically connected.

In addition, in the first high speed transmission line board, the first elastomer sheet having the fixed dielectric constant and the first elastomer that forms the ground layers that are conductive, are alternately arrayed to form an anisotropic conductive sheet. The first elastomer sheet and the first elastomer are arrayed alternately and contiguously in a longitudinal direction (a direction linking two ends of the plural first elastomer strips).

On the other hand, in the first inner layer board, the second elastomer sheet that is nonconductive and the second elastomer that forms the ground layers that are conductive, are alternately arrayed, to form an anisotropic conductive sheet. The second elastomer sheet and the second elastomer are arrayed alternately and contiguously in a longitudinal direction (a direction linking two ends of the plural first elastomer strips).

By the faces of the connecting sheet, formed of the multilayer board, being pressed together, the first elastomer and the second elastomer form an electromagnetic shielding wall that completely separates the first high speed transmission lines. Moreover, the first elastomer and the second elastomer are each in conductive contact with the ground board, so that each of the high speed transmission lines is electromagnetically shielded in three dimensions as if framed by a quadrangular prism-shaped pipe.

In a preferred embodiment, the plural second elastomer strips that are conductive may be arrayed at one edge among two opposing edges of the second elastomer sheet that has a rectangular shape, and the plural third elastomer strips that are conductive may be arrayed at the other edge opposite the one edge among the two opposing edges on the third elastomer sheet that has a rectangular shape.

In the connecting sheet, formed of the multilayer board in which the second surface layer board, the first ground board, the first high speed transmission line board, the first inner layer board, the second ground board, and the first surface layer board are laminated, in that order, if one of the external connecting terminals is in pressurized contact with one edge of the first surface layer board, and the other of the external connecting terminals is in pressurized contact with the other edge of the second surface layer board, the external connecting terminals and the plural first high speed transmission lines are connected by a path through one of the external connecting terminals, the second elastomer strips, the fourth elastomer strips, the first elastomer strips, the first high speed transmission lines, the first elastomer strips, the third elastomer strips, and the other of the external connecting terminals.

In this type of connecting sheet, one of the external connecting terminals disposed at the front surface layer and the other of the external connecting terminals disposed on the back surface layer can be connected by the high speed transmission lines, without going through a via.

In addition, by the faces of the connecting sheet formed of the multilayer board being pressed together, the first elastomer and the second elastomer form the electromagnetic shielding wall that completely separates the first high speed transmission lines. Moreover, the first elastomer and the second elastomer are each in conductive contact with the ground board, so that each of the high speed transmission lines is electromagnetically shielded in three dimensions as if framed by a quadrangular prism-shaped pipe.

In this type of connecting sheet, since the high speed transmission lines are electromagnetically shielded in three dimensions as if framed by the ground board and an elastomer that is conductive, crosstalk between the high speed transmission lines can more assuredly be prevented.

In the connecting sheet, in which the high speed transmission lines are electromagnetically shielded in three dimensions as if framed by the ground board and the elastomer that is conductive, as described in the seventh aspect of the present invention, the elastomer between the multiple layers, that forms the ground layers, and the elastomer and the ground board may each be joined in advance, by electrically conductive adhesive.

In the eighth aspect of the present invention, on the second high speed transmission line board, plural fifth elastomer strips, that are conductive between front and back surfaces, may be arrayed corresponding to the pitch of the external connecting terminals, at two edges of the fifth elastomer sheet that has a fixed dielectric constant. Moreover, plural fifth elastomer strips corresponding to the pitch of the first high speed transmission lines may be arrayed at two edges of the fifth elastomer sheet that has the fixed dielectric constant. Accordingly, at two edges of the fifth elastomer sheet, the fifth elastomer sheet and the fifth elastomer strips are alternately arrayed, to form an anisotropic conductive sheet.

In setting out the fifth elastomer strips, which are conductive, on the fifth elastomer sheet that has the fixed dielectric constant, reciprocal chemical joining may be used in making the anisotropic conductive sheet. In order to realize this type of joining, a coupling agent may be used between members. As a bonding agent for joining these members, this type of coupling agent may include normal commercially available adhesive. Specifically, the coupling agent may be silane based, aluminum based, titanate based, or the like, and a silane coupling agent may satisfactorily be used.

In a preferred embodiment, the plural fifth elastomer strips that are electrically conductive may be arrayed at two opposing edges of the fifth elastomer sheet that has a rectangular shape. Furthermore, in another preferred embodiment, the fifth elastomer strips that are electrically conductive may be arrayed at two adjacent mutually orthogonal edges of the fifth elastomer sheet that has a rectangular shape.

After copper foil is laminated and disposed on one surface of the fifth elastomer sheet on which the plural first elastomer strips are arrayed at two edges, high speed transmission lines are formed in a pattern by a print etching method, on the second high speed transmission line board. This second high speed transmission line board has a stripline structure, with copper foil plating laminated to form ground layers facing the high speed transmission lines.

The second high speed transmission line board has the plural fifth elastomer strips that form edge connectors at two edges, the plural fifth elastomer strips are connected, for example, in a pattern by paired differential signal lines, and the overall high speed transmission line board may be flexible in the direction of sheet thickness.

Plural sixth elastomer strips that are conductive are arrayed at two edges of the sixth elastomer sheet, that is nonconductive, to form an anisotropic conductive sheet on the second inner layer board. In other words, the sixth elastomer strips are arrayed alternately with the sixth elastomer sheet at two edges of the sixth layer board, formed of the sixth elastomer sheet that is nonconductive, to form the anisotropic conductive sheet. The anisotropic conductive sheet, formed at two edges of the second inner layer board, functions as an edge connector electrically connecting the first elastomer strips on the first high speed transmission line board and the fifth elastomer strips on the second high speed transmission line board.

In addition, in the second high speed transmission line board, the fifth elastomer sheet that has a fixed dielectric constant and the third elastomer that forms ground layers that are conductive, are alternately arrayed, to form an anisotropic conductive sheet. The fifth elastomer sheet and the third elastomer are arrayed alternately and contiguously in a longitudinal direction (a direction linking two ends of the plural first elastomer strips).

On the other hand, in the second inner layer board, the sixth elastomer sheet that is nonconductive and the fourth elastomer that forms conductive ground layers are alternately arrayed, to form an anisotropic conductive sheet. The sixth elastomer sheet and the fourth elastomer are arrayed alternately and contiguously in a longitudinal direction (a direction linking two ends of the sixth elastomer strips).

By the surfaces of the connecting sheet, formed of the multilayer board, being pressed together, the third elastomer and the fourth elastomer form an electromagnetic shielding wall that completely separates the second high speed transmission lines. Moreover, the third elastomer and the fourth elastomer are each in conductive contact with the ground board, so that each of the high speed transmission lines is electromagnetically shielded in three dimensions as if framed by a quadrangular prism-shaped pipe.

In this type of connecting sheet, since the high speed transmission lines are electromagnetically shielded in three dimensions as if framed by the ground board and the elastomer that are conductive, crosstalk between the high speed transmission lines can assuredly be prevented.

Moreover, according to the eighth aspect of the present invention, the plural first elastomer strips that are conductive are arrayed at regular intervals at two edges of the first elastomer sheet, in the first high speed transmission line board. The first high speed transmission lines are in a pattern alternating at regular intervals with the plural first elastomer strips at the two edges.

On the other hand, on the second high speed transmission line board, the plural fifth elastomer strips, that are conductive, are arrayed at regular intervals at two edges of the fifth elastomer sheet. Furthermore, the second high speed transmission lines are arranged at regular intervals in an alternating pattern between the two ends of the plural fifth elastomer strips, so as to alternate with the first high speed transmission lines.

In this way, when the plural external connecting terminals are disposed at two edges of the connecting sheet formed of the multilayer board, and the plural external connecting terminals are pressed onto the first surface layer board, the plural first high speed transmission lines and the external connecting terminals are connected by a first path through one of the external connecting terminals, the second elastomer strips, the fourth elastomer strips, the first elastomer strips, the first high speed transmission lines, the first elastomer strips, the fourth elastomer strips, the second elastomer strips, and the other of the external connecting terminals.

Moreover, the plural second high speed transmission lines and the external connecting terminals are connected by a second path through one of the external connecting terminals, the second elastomer strips, the fourth elastomer strips, the first elastomer strips, the sixth elastomer strips, the fifth elastomer strips, the second high speed transmission lines, the fifth elastomer strips, the sixth elastomer strips, the first elastomer strips, the fourth elastomer strips, the second elastomer strips, and the other of the external connecting terminals.

In this way, the connecting sheet formed of the multilayer board, in which the high speed transmission lines are arrayed on two layers, has inter-layer connectivity by elastomer strips instead of vias, and since the high speed transmission lines are arrayed alternately between layers, while providing electromagnetic shielding between the high speed transmission lines by the elastomers forming the ground layers, crosstalk between the high speed transmission lines does not occur, and packaging density for the overall high speed transmission lines can be raised.

In the connecting sheet according to the eleventh aspect of the present invention, the plural first elastomer strips, that are conductive between front and back surfaces, may be arrayed corresponding to the pitch of the external connecting terminals at two edges of the first elastomer sheet that has a fixed dielectric constant, on the first high speed transmission line board. Moreover, plural first elastomer strips corresponding to the pitch of the first high speed transmission lines may be arrayed at the two edges of the first elastomer sheet that has the fixed dielectric constant. Accordingly, at the edges of the first elastomer sheet, the first elastomer sheet and the first elastomer strips are alternately arrayed, to form the anisotropic conductive sheet.

In setting out the first elastomer strips, which are conductive, on the first elastomer sheet, which has the fixed dielectric constant, to make the anisotropic conductive sheet, chemical bonding may be used. In order to realize this type of bonding, a coupling agent may be used between members. As a bonding agent for joining these members, this type of coupling agent may include normal commercially available adhesive. Specifically, the coupling agent may be silane based, aluminum based, titanate based, or the like, and a silane coupling agent may satisfactorily be used.

In a preferred embodiment, the plural first elastomer strips that are conductive may be arrayed at two opposing edges on the first elastomer sheet that has a rectangular shape. Furthermore, in another preferred embodiment, the first elastomer strips that are electrically conductive may be arrayed at two adjacent mutually orthogonal edges of the first elastomer sheet that has a rectangular shape.

After copper foil is laminated and disposed on one face of the first elastomer sheet on which the plural first elastomer strips are arrayed at the two edges, high speed transmission lines may be formed in a pattern by a print etching method, on the first high speed transmission line board. This first high speed transmission line board has a stripline structure in which copper foil plating is laminated to form ground layers facing the high speed transmission lines.

In the second high speed transmission line board, the plural fifth elastomer strips, which are conductive between front and back surfaces, may be arrayed corresponding to the pitch of the external connecting terminals, at two edges of the fifth elastomer sheet that has the fixed dielectric constant. Moreover, the plural fifth elastomer strips may be arrayed corresponding to the pitch of the second high speed transmission lines at two edges of the fifth elastomer sheet that has the fixed dielectric constant. Accordingly, at the two edges of the fifth elastomer sheet, the fifth elastomer strips are arrayed alternately with the fifth elastomer sheet, to form an anisotropic conductive sheet.

In setting out the fifth elastomer strips that are conductive, on the fifth elastomer sheet that has the fixed dielectric constant, to make the anisotropic conductive sheet, chemical bonding may be used. In order to realize this type of bonding, a coupling agent may be used between members. As a bonding agent for joining these members, this type of coupling agent may include normal commercially available adhesive. Specifically, the coupling agent may be silane based, aluminum based, titanate based, or the like, and a silane coupling agent may satisfactorily be used.

In a preferred embodiment, the plural fifth elastomer strips that have electrical conductivity may be arrayed at two opposing edges on the fifth elastomer sheet that has a rectangular shape. Furthermore, in another preferred embodiment, the fifth elastomer strips that are electrically conductive may be arrayed at two adjacent mutually orthogonal edges of the fifth elastomer sheet that has a rectangular shape.

After copper foil is laminated and disposed on one face of the fifth elastomer sheet on which the plural first elastomer strips are arrayed at the two edges, high speed transmission lines may be formed in a pattern by a print etching method, on the second high speed transmission line board. This second high speed transmission line board has a stripline structure, with copper foil plating laminated to form ground layers facing the high speed transmission lines.

The plural second elastomer strips that are conductive are arrayed at two edges of the second elastomer sheet, that is nonconductive, to form an anisotropic conductive sheet, on the first inner layer board. In other words, the second elastomer sheet and the second elastomer strips are arrayed alternately on the two edges to form an anisotropic conductive sheet in a top sheet formed by the second elastomer sheet that is nonconductive. This anisotropic conductive sheet formed at the two edges functions as an edge connector to which the external connecting terminals are electrically connected.

The plural fourth elastomer strips that are conductive are arrayed at two edges of the fourth elastomer sheet, that is nonconductive, to form an anisotropic conductive sheet on the first inner layer board. In other words, the fourth elastomer sheet and the fourth elastomer strips are arrayed alternately on the two edges, to form the anisotropic conductive sheet on the first inner layer board formed of the fourth elastomer sheet that is nonconductive. The anisotropic conductive sheet formed at the two edges functions as an edge connector electrically connecting elastomer strips, which are conductive, laminated on the front and back surfaces of the anisotropic conductive sheet.

The plural sixth elastomer strips that are conductive are arrayed at two edges of the sixth elastomer sheet, that is nonconductive, to form an anisotropic conductive sheet on the second inner layer board. In other words, the sixth elastomer sheet and the sixth elastomer strips are arrayed alternately at two edges to form the anisotropic conductive sheet, on the second inner layer board, formed of the sixth elastomer sheet that is nonconductive. The anisotropic conductive sheet formed at the two edges functions as an edge connector electrically connecting elastomer strips, that are conductive, laminated on the front and back surfaces of the anisotropic conductive sheet.

The plural seventh elastomer strips, that are conductive, are arrayed at two edges of the seventh elastomer sheet, which is nonconductive, to form an anisotropic conductive sheet on the third inner layer board. In other words, the seventh elastomer sheet and the seventh elastomer strips are arrayed alternately at the two edges, to form an anisotropic conductive sheet, on the third inner layer board formed of the seventh elastomer sheet that is nonconductive. The anisotropic conductive sheet formed at the two edges functions as an edge connector electrically connecting elastomer strips, that are conductive, laminated on the front and back surfaces of the anisotropic conductive sheet.

Furthermore, on the first high speed transmission line board, the first elastomer sheet, which has the fixed dielectric constant, on which the first high speed transmission lines are formed, is arrayed so as to be sandwiched by the first elastomer, that forms ground layers that are conductive, and an anisotropic conductive sheet is formed. On the other hand, on the second high speed transmission line board, the fifth elastomer sheet, which has the fixed dielectric constant, on which the second high speed transmission lines are formed, is arrayed so as to be sandwiched by the second elastomer, that forms ground layers that are conductive, to form an anisotropic conductive sheet.

In the connecting sheet formed of the multilayer board built up from, in order, the bottom sheet, the fourth ground board, the second high speed transmission line board, the third inner layer board, the third ground board, the third inner layer board, the first ground board, the first high speed transmission line board, the first inner layer board, the second ground board, and the first surface layer board, by the first elastomer and the third elastomer being in contact, an electromagnetic shielding wall that completely separates the third high speed transmission lines is formed. Moreover, the first elastomer and the third elastomer are each in conductive contact with the ground board, so that each of the high speed transmission lines is electromagnetically shielded in three dimensions as if framed by a quadrangular prism-shaped pipe.

On the other hand, by the second elastomer on the second high speed transmission line board and the fourth elastomer on the second inner layer board being in contact, an electromagnetic shielding wall that completely separates the second high speed transmission lines is formed. Moreover, the second elastomer and the fourth elastomer are each in conductive contact with the ground board, so that each of the high speed transmission lines is electromagnetically shielded in three dimensions as if framed by a quadrangular prism-shaped pipe.

In this way, in the connecting sheet formed of the multilayer board, even in cases in which the high speed transmission lines between layers intersect in three dimensions, crosstalk between the high speed transmission lines can be electromagnetically shielded in three dimensions. In addition, in a multilayer board having a three dimensional stripline, signal lines can be connected in three dimensions by an electrically conductive elastomer, without connecting in three dimensions by a via, as done conventionally in order to prevent short circuits.

EFFECTS OF THE INVENTION

In the connecting sheet according to the present invention, surface contact is implemented so that the external connecting terminals are firmly attached to the plural elastomer strips that are electrically conductive and form the edge connectors, so that there is no air layer between the external connecting terminals and the edge connectors, and an effect is realized in that reflection of high speed signals at connection extremities of the external connecting terminals does not easily occur.

Furthermore, in the connecting sheet according to the present invention, since the high speed transmission lines are electromagnetically shielded in three dimensions as though framed by the ground boards and the elastomers that are conductive, it is possible to more assuredly prevent crosstalk between the high speed transmission lines.

Moreover, in the connecting sheet according to the present invention composed of the multilayer board on which the high speed transmission lines are arrayed on two layers, connectivity between layers is realized by elastomer strips instead of vias, and the high speed transmission lines are alternately arrayed between layers, while providing electromagnetic shielding between the high speed transmission lines by the elastomers forming the ground layers, so that crosstalk does not occur between the high speed transmission lines, and it is possible to raise the packaging density of the overall high speed transmission lines.

In addition, in the connecting sheet formed of the multilayer board according to the present invention, even in cases in which the high speed transmission lines between layers intersect in three dimensions, crosstalk between the high speed transmission lines can be electromagnetically shielded in three dimensions. In addition, in the multilayer board having three dimensional striplines, signal lines can be connected in three dimensions by the electrically conductive elastomers, without connecting in three dimensions by a via, as is done conventionally in order to prevent short circuits.

EXPLANATION OF REFERENCE SYMBOLS

Figure 1:
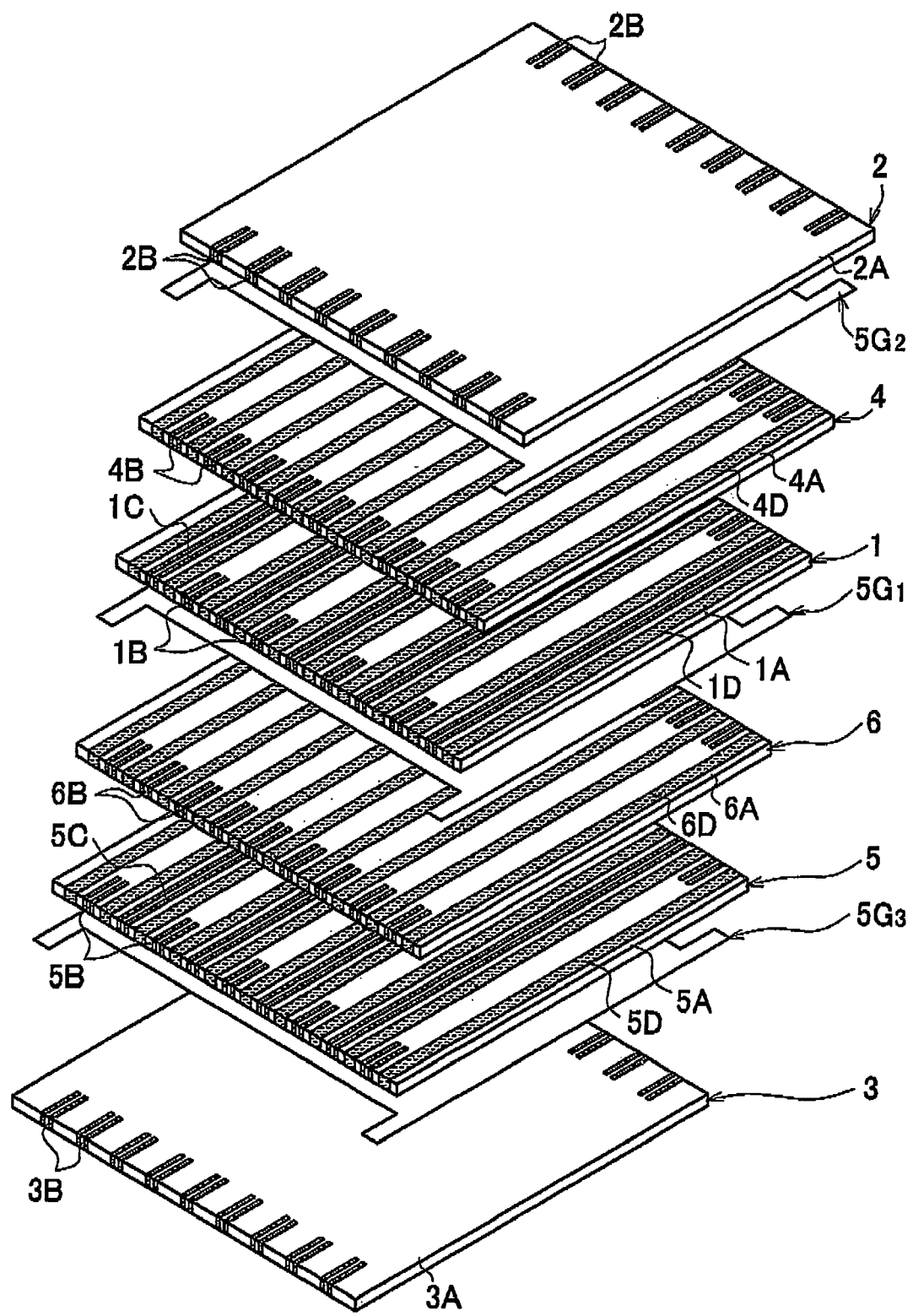
FIG. 1 is a perspective exploded view showing a configuration of a connecting sheet in a first embodiment of the present invention.

1, 7 first high speed transmission line board
1A, 7A first elastomer sheet
1B, 7B first elastomer strips
1C, 7C first high speed transmission lines
1D, 7D first elastomer
2, 9 first surface layer board
2A, 9A second elastomer sheet
2B, 9B second elastomer strips
3 second surface layer board
3A, 13A third elastomer sheet
3B third elastomer strips
4, 10 first inner layer board
4A, 10A fourth elastomer sheet
4B, 10B fourth elastomer strips
4D, 10D second elastomer
5, 8 second high speed transmission line board
5A, 8A fifth elastomer sheet
5B, 8B fifth elastomer strips
5C, 8C second high speed transmission lines
5D, 8D third elastomer
5G, 7G ground board
6, 11 second inner layer board
6A, 11A sixth elastomer sheet
6B, 11B sixth elastomer strips
6D, 11D fourth elastomer
11P, 12P plug pins
12 third inner layer board
12A seventh elastomer sheet
12B seventh elastomer strips
13 bottom sheet
100, 200 connecting sheet
100A multilayer board

PREFERRED MODE FOR CARRYING OUT THE INVENTION

Below, preferred embodiments of the present invention are explained with reference to the drawings.

FIG. 1 is a perspective exploded view showing a configuration of a connecting sheet 100 in a first embodiment of the present invention. In FIG. 1, reference symbol 1 denotes a first high speed transmission line board, reference symbol 2 denotes a first surface layer board, and reference symbol 3 denotes a second surface layer board. Furthermore, reference symbol 4 denotes a first inner layer board, reference symbol 5 denotes a second high speed transmission line board, reference symbol 6 denotes a second inner layer board, and reference symbol 5G denotes ground boards. Moreover, three ground boards 5G are provided, and in cases in which they are distinguished, a first ground board is denoted $5G_1$, a second ground board is denoted $5G_2$, and a third ground board is denoted $5G_3$.

In the first embodiment in FIG. 1, the main portion of the first high speed transmission line board 1 is formed of a first elastomer sheet 1A, having a fixed dielectric constant, in which an elastomer that has a fixed dielectric constant is formed in an approximately rectangularly shaped sheet. On a pair of opposing edges (two edges) of the first elastomer sheet 1A that forms a substrate for the first high speed transmission line board, plural first elastomer strips 1B that are electrically conductive between front and back surfaces are arrayed so as to be opposite one another. The first elastomer strips 1B, which are conductive, are composed of a material in which electrically conductive particles are mixed into silicone rubber. At two edges of the first high speed transmission line board 1, the first elastomer strips 1B are alternately arrayed with the first elastomer sheet 1A, to form an anisotropic conductive sheet.

Plural first high speed transmission lines 1C are formed in a pattern on the surface of the first elastomer sheet 1A, and the plural first high speed transmission lines 1C connect the two ends of the plural first elastomer strips 1B. Among the first elastomer strips 1B that are lined up on a same edge of the first elastomer sheet 1A, pairs are formed of two adjacent strips, to make first elastomer strip pairs, and the first high speed transmission lines 1C are connected at regular intervals, alternately with the first elastomer strip pairs. In the embodiment in FIG. 1, the plural first high speed transmission lines 1C are composed of differential signal paths that form pairs. The first ground board $5G_1$, described below, is laminated on one surface (back face) of the first elastomer sheet 1A opposite the plural first high speed transmission lines 1C, and the first high speed transmission line board 1 has a stripline structure.

Furthermore, in the first high speed transmission line board 1, a first elastomer 1D forming plural ground layers that are conductive between front and back surfaces is arrayed in parallel to the first high speed transmission lines 1C so as to sandwich the first high speed transmission lines 1C. The first elastomer 1D that is conductive is composed of a material in which electrically conductive particles are mixed into silicone rubber.

In the first high speed transmission line board 1, the first elastomer sheet 1A, that has the fixed dielectric constant, and the first elastomer 1D, that forms the conductive ground layers, are alternately arrayed, to form an anisotropic conductive sheet. The first elastomer sheet 1A and the first elastomers 1D are arrayed alternately and contiguously in a longitudinal direction (a direction linking two ends of the plural first elastomer strips 1B).

In the first embodiment in FIG. 1, a first surface layer board 2 is formed as a sheet of an elastomer that is electrically nonconductive. At two edges of a second elastomer sheet 2A that forms a substrate for the first surface layer board 2, plural second elastomer strips 2B, that are conductive between front and back surfaces, are arrayed so as be facing each other. The plural second elastomer strips 2B, which are conductive, are arrayed in association with the plural first elastomer strips 1B. In the second elastomer strips that are conductive, electrically conductive particles are mixed into an elastomer that is relatively flexible. At two edges of the first surface layer board 2, the second elastomer strips 2B, which are conductive, alternate with the second elastomer sheet 2A that is nonconductive, to form an anisotropic conductive sheet.

In the same way, in the embodiment in FIG. 1, the main portion of a second surface layer board 3 is formed of a third elastomer sheet 3A, in which elastomer raw material that is nonconductive is formed in an approximately rectangularly shaped sheet. On a pair of opposing edges (two edges) of the third elastomer sheet 3A that forms a substrate for the second surface layer board 3, plural third elastomer strips 3B, that are conductive between front and back surfaces, are arrayed so as to be opposite one another. The plural third elastomer strips 3B, which are conductive, are arrayed in association with the plural first elastomer strips 1B. The third elastomer strips 3B, which are conductive, are composed of material in which electrically conductive particles are mixed into elastomer raw material that is relatively flexible. At the two edges of the second surface layer board 3, the third elastomer sheet 3A that is nonconductive, and the third elastomer strips 3B that are conductive, are arrayed alternately, to form an anisotropic conductive sheet.

In the embodiment in FIG. 1, the main portion of the first inner layer board 4 is formed of a fourth elastomer sheet 4A, in which an elastomer that is nonconductive is formed in an approximately rectangularly shaped sheet. On a pair of opposing edges (two edges) of the fourth elastomer sheet 4A that forms a substrate for the first inner layer board 4, plural fourth elastomer strips 4B, that are conductive between front and back surfaces, are arrayed so as to be opposite one another. The fourth elastomer strips 4B, that are conductive, are composed of a material in which electrically conductive particles are mixed into silicone rubber. At two edges of the fourth inner layer board 4, the fourth elastomer sheet 4A and the fourth elastomer strips 4B are arrayed alternately, to form an anisotropic conductive sheet.

Furthermore, on the first inner layer board 4, a second elastomer 4D that forms plural ground layers, that are conductive between front and back surfaces, is arrayed in association with first elastomer 1D. The second elastomer 4D, that is conductive, is composed of a material in which electrically conductive particles are mixed into silicone rubber.

In the first inner layer board 4, the fourth elastomer sheet 4A, that is nonconductive, and the second elastomer 4D are alternately arrayed, to form an anisotropic conductive sheet. The fourth elastomer sheet 4A and the second elastomer 4D are arrayed alternately and contiguously in a longitudinal direction (a direction linking two ends of the plural fourth elastomer strips 4B).

In the embodiment in FIG. 1, the main portion of the second high speed transmission line board 5 is formed of a fifth elastomer sheet 5A, in which an elastomer that has a fixed dielectric constant is formed in an approximately rectangularly shaped sheet. On a pair of opposing edges (two edges) of the fifth elastomer sheet 5A that forms a substrate for the second high speed transmission line board 5, plural fifth elastomer strips 5B, that are conductive between front and back surfaces, are arrayed so as to be opposite one another. The fifth elastomer strips 5B, which are conductive, are composed of a material in which electrically conductive particles are mixed into silicone rubber. At two edges of the second high speed transmission line board 5, the fifth elastomer sheet 5A and the fifth elastomer strips 5B are alternately arrayed, to form an anisotropic conductive sheet.

Plural second high speed transmission lines 5C are formed in a pattern on a surface of the fifth elastomer sheet 5A, and the plural second high speed transmission lines 5C connect two ends of the plural fifth elastomer strips 5B. Among the fifth elastomer strips 5B that are lined up on a same edge of the fifth elastomer sheet 5A, pairs are formed of two adjacent strips, to make fifth elastomer strip pairs, and the second high speed transmission lines 5C are connected at regular intervals, alternating with the fifth elastomer strip pairs, so as to alternate with the plural first high speed transmission lines 1C. In the embodiment in FIG. 1, the plural second high speed transmission lines 5C are composed of differential signal paths that form pairs. The third ground board $5G_3$ is laminated on one face (back face) of the fifth elastomer sheet 5A opposite the plural second high speed transmission lines 5C, and the second high speed transmission line board 5 has a stripline structure.

Furthermore, on the second high speed transmission line board 5, a third elastomer 5D, forming plural ground layers that are conductive between front and back surfaces, is disposed in parallel to the second high speed transmission lines 5C so as to sandwich the second high speed transmission lines 5C. The third elastomer strips 5D, which are conductive, are composed of a material in which electrically conductive particles are mixed into silicone rubber.

In the second high speed transmission line board 5, the fifth elastomer sheet 5A that has a fixed dielectric constant, and the third elastomer 5D, that forms the conductive ground layers, are alternately arrayed, to form an anisotropic conductive sheet. The fifth elastomer sheet 5A and the third elastomer 5D are arrayed alternately and contiguously in a longitudinal direction (a direction linking two ends of the fifth elastomer strips 5B).

In the embodiment in FIG. 1, the main portion of the second inner layer board 6 is composed of a sixth elastomer sheet, in which an elastomer that is nonconductive is formed in an approximately rectangularly shaped sheet. At a pair of opposing edges (two edges) of the sixth elastomer sheet 6A that forms a substrate for the second inner layer board 6, plural sixth elastomer strips 6B, which are conductive between front and back surfaces, are arrayed so as be facing each other. The sixth elastomer strips 6B, which are conductive, are composed of a material in which electrically conductive particles are mixed into silicone rubber. At two edges of the second inner layer board 6, the sixth elastomer sheet 6A and the sixth elastomer strips 6B are arrayed alternately, to form an anisotropic conductive sheet.

Furthermore, in the second inner layer board 6, a fourth elastomer 6D, forming plural ground layers that are conductive between front and back surfaces, is disposed in association with the third elastomer 5D that forms plural ground layers. The fourth elastomer 6D, that is conductive, is composed of a material in which electrically conductive particles are mixed into silicone rubber.

In the second inner layer board 6, the sixth elastomer sheet 6A, that is nonconductive, and the fourth elastomer 6D that forms conductive ground layers, are alternately arrayed, to form an anisotropic conductive sheet. The sixth elastomer sheet 6A and the fourth elastomer 6D are arrayed alternately and contiguously in a longitudinal direction (a direction linking two ends of the sixth elastomer strips 6B).

The ground boards $5G_1$ to $5G_3$, composed of copper foil plating, have the same configuration, and have at least a width that is in contact with the first elastomer 1D that forms plural ground layers. In the embodiment in FIG. 1, two edges of the ground boards 5G are notched so as not to have contact with the elastomer strips 1B to 6B that are conductive.

Figure 2:
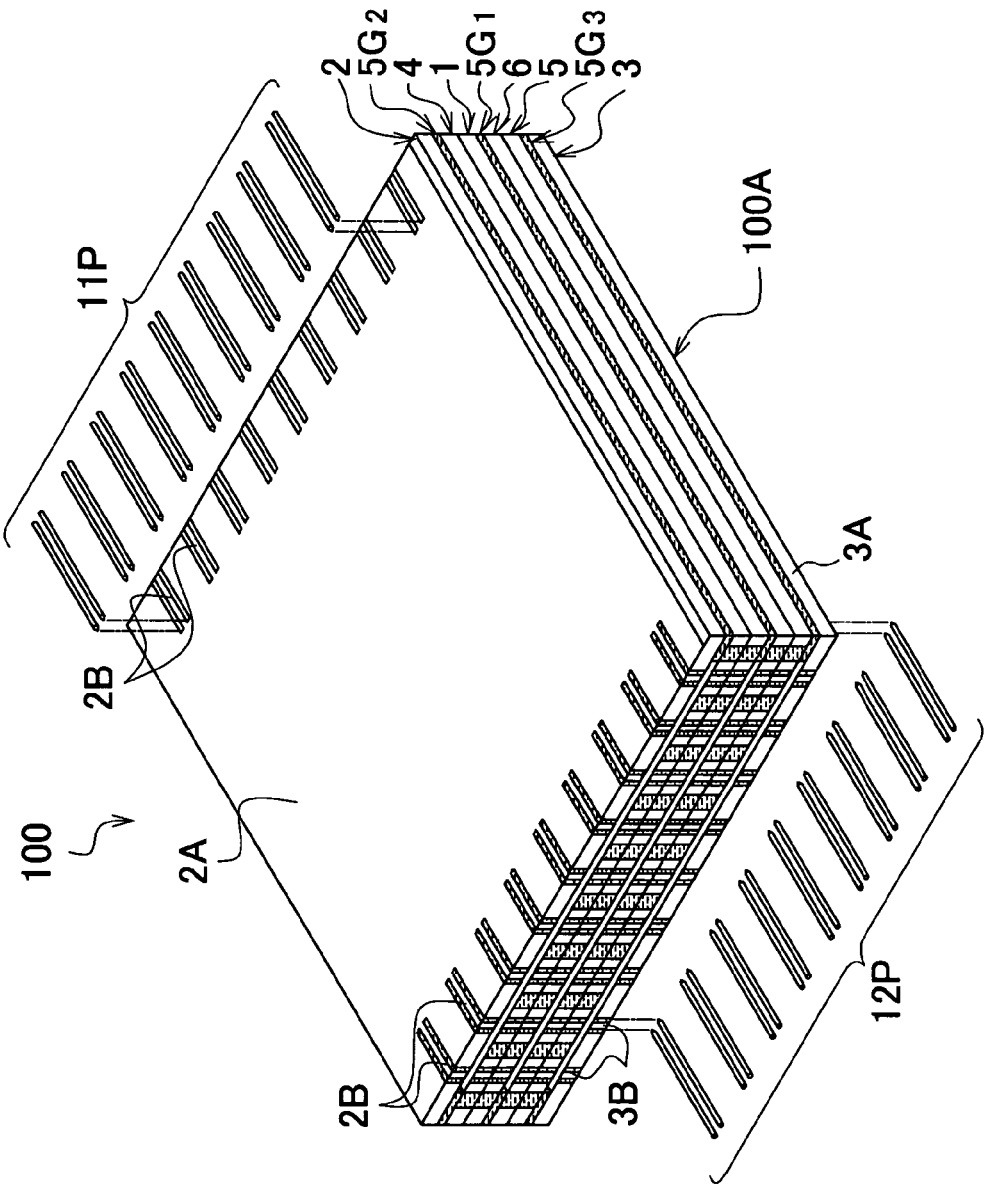
FIG. 2 is a perspective outline view of the connecting sheet in the first embodiment of the present invention.

If the connecting sheet 100, composed as above, is laminated with the second surface layer board 3, the third ground board 5G, the second high speed transmission line board 5, the second inner layer board 6, the first ground board 5G, the first high speed transmission line board 1, the first inner layer board 4, the second ground board 5G, and the first surface layer board 2, in that order, and the laminates are bonded, the multilayer board 100A is formed, and the connecting sheet 100, shown in FIG. 2, including this multilayer board 100, can be obtained.

FIG. 2 is a perspective outline view of the connecting sheet 100 in the first embodiment of the present invention. The ground boards 5G are copper foil plating with a thickness of 35 micrometers or less; however, in order to make the configuration of the ground boards 5G clear in FIG. 2, the thickness is exaggerated.

Furthermore, in laminating the connecting sheet 100 shown in FIG. 2, the first ground board $5G_1$ and the first elastomer 1D may be joined by electrically conductive adhesive, and the first elastomer 1D and the second elastomer 4D may also be joined by electrically conductive adhesive. In the same way, the second ground board $5G_2$ and the second elastomer 4D may be joined by electrically conductive adhesive, and in this way, an electromagnetic shielding wall is formed between the plural first high speed transmission lines 1C.

In the same way, in laminating the connecting sheet 100 as shown in FIG. 2, the third ground board $5G_3$ and the third elastomer 5D may be joined by electrically conductive adhesive, and the third elastomer 5D and the fourth elastomer 6D may also be joined by electrically conductive adhesive. In the same way, the third ground board $5G_3$ and the fourth elastomer 6D may be joined by electrically conductive adhesive, and in this way, an electromagnetic shielding wall is formed between the plural second high speed transmission lines 5C. Moreover, the fourth elastomer 6D and the first ground board $5G_1$ may also be joined.

In the embodiment in FIG. 2, plug pins 11P that form one of a pair of external connecting terminals are arrayed above one edge of the connecting sheet 100. The plug pins 11P are arrayed at intervals the same as the conductive second elastomer strips 2B that are arrayed at two edges of the first surface layer board 2.

On the other hand, in the embodiment in FIG. 2, plug pins 12P that form the other external connecting terminal are arrayed below the other edge of the connecting sheet 100. The plug pins 12P are arrayed at intervals the same as the conductive third elastomer strips 3B that are arrayed at two edges of the second surface layer board 3.

In FIG. 2, if the faces of the overall connecting sheet 100 are pressed together with the plug pins 11P and the plug pins 12P, the plural first high speed transmission lines 1C and the plural second high speed transmission lines 5C between the plug pins 11P and the plug pins 12P can be connected.

Figure 3:
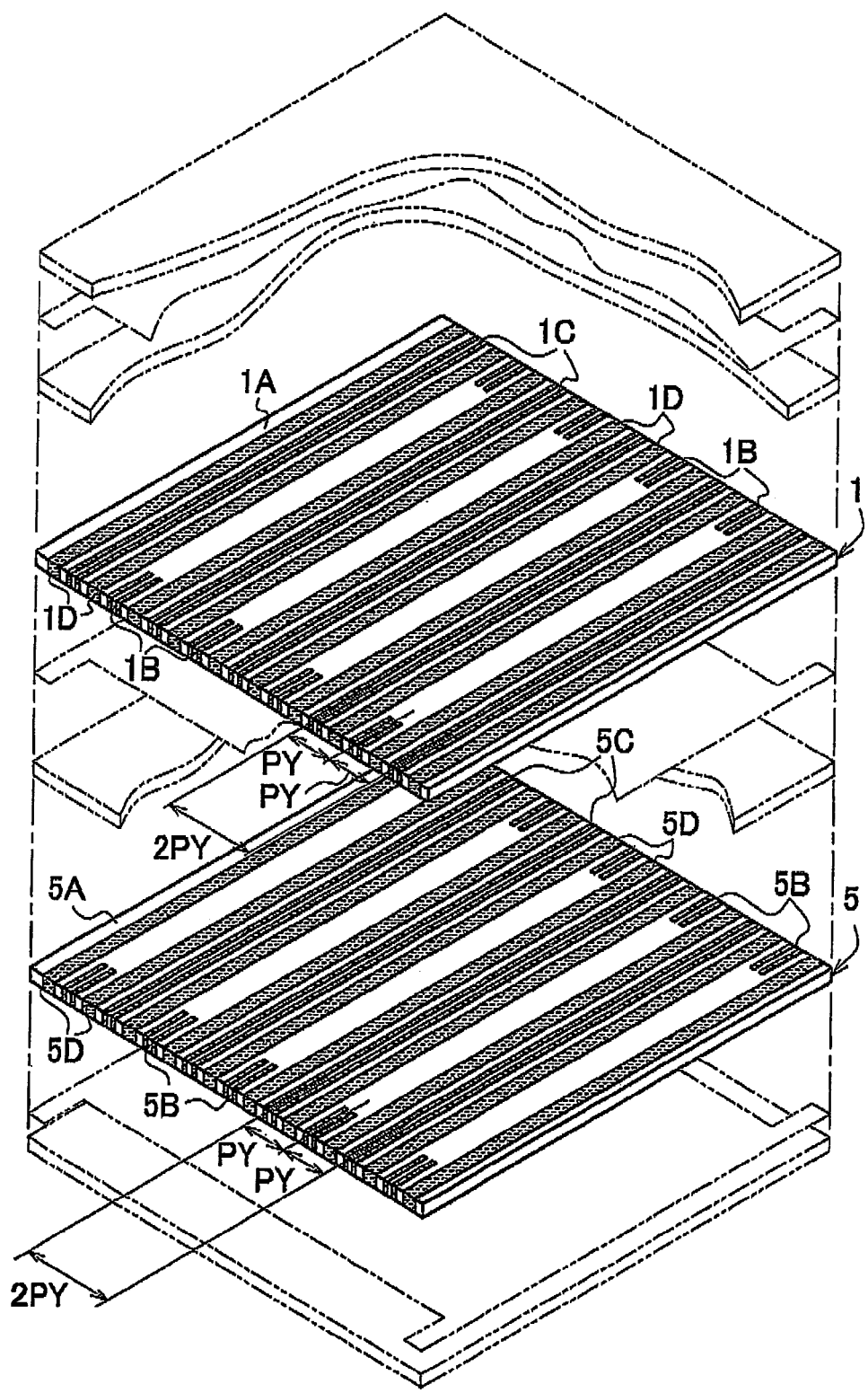
FIG. 3 is a perspective exploded view in which a first high speed transmission line board and a second high speed transmission line board are extracted from FIG. 1.

FIG. 3 is an exploded perspective view in which the first high speed transmission line board 1 and the second high speed transmission line board 5 are extracted from FIG. 1.

As shown in FIG. 3, the plural first elastomer strips 1B that are conductive between front and back surfaces are arrayed at two edges of the first high speed transmission line board 1. Among the first elastomer strips 1B that are lined up along a same side of the first elastomer sheet 1A, first elastomer strip pairs are formed of two adjacent strips, and the first elastomer strip pairs are arrayed at a regular interval shown by PY. The first high speed transmission lines 1C connect the two ends of the pairs of first elastomer strips 1B that are opposite each other, arrayed at the two edges of the first elastomer sheet 1A. On the first high speed transmission line board 1, first elastomer strip pairs that include two adjacent first elastomer strips 1B, one end of which is connected to the first high speed transmission lines 1C, and first elastomer strip pairs that include two adjacent first elastomer strips 1B, not connected to the first high speed transmission lines 1C, are disposed alternately, and the first high speed transmission lines 1C are disposed at regular intervals, alternately with the first elastomer strip pairs. In addition, the first high speed transmission lines 1C are electromagnetically shielded by the first elastomer 1D, forming plural ground layers that are conductive between front and back surfaces, and disposed so as to sandwich the first high speed transmission lines 1C.

In the same way, as shown in FIG. 3, the plural fifth elastomer strips 5B that are conductive between front and back surfaces, are arrayed on the two edges of the second high speed transmission line board 5. Among the fifth elastomer strips 5B that are lined up along a same side of the fifth elastomer sheet 5A, fifth elastomer strip pairs are formed of two adjacent strips, and the fifth elastomer strip pairs are arrayed at a regular interval shown by PY. The second high speed transmission lines 5C connect two ends of pairs of fifth elastomer strips 5B that are opposite each other, arrayed at the two edges of the fifth elastomer sheet 5A. On the second high speed transmission line board 5, fifth elastomer strip pairs that include two adjacent strips of the fifth elastomer strips 5B, one end of which is connected to the second high speed transmission lines 5C, and fifth elastomer strip pairs that include two adjacent strips of the fifth elastomer strips 5B, not connected to the second high speed transmission lines 5C, are alternately disposed, and the second high speed transmission lines 5C are disposed at regular intervals, alternately with the fifth elastomer strip pairs. In addition, the second high speed transmission lines 5C are electromagnetically shielded by the third elastomer 5D, forming plural ground layers that are conductive between front and back surfaces and disposed so as to sandwich the second high speed transmission lines 5C.

The first high speed transmission line board 1 and the second high speed transmission line board 5 are laminated and disposed so that the first high speed transmission lines 1C alternate with the second high speed transmission lines 5C. If faces are pressed together in the overall connecting sheet 100 configured in this way, the first ground board $5G_1$ and the first elastomer 1D, the first elastomer 1D and the second elastomer 4D, and the second elastomer 4D and the second ground board $5G_2$, are respectively in contact, so that an electromagnetic shielding wall is formed between the plural first high speed transmission lines 1C.

In the same way, the third ground board $5G_3$ and the third elastomer 5D, the third elastomer 5D and the fourth elastomer 6D, and the fourth elastomer 6D and the first ground board $5G_1$ are respectively in contact, so that an electromagnetic shielding wall is formed between the plural second high speed transmission lines 5C.

Figure 4A:
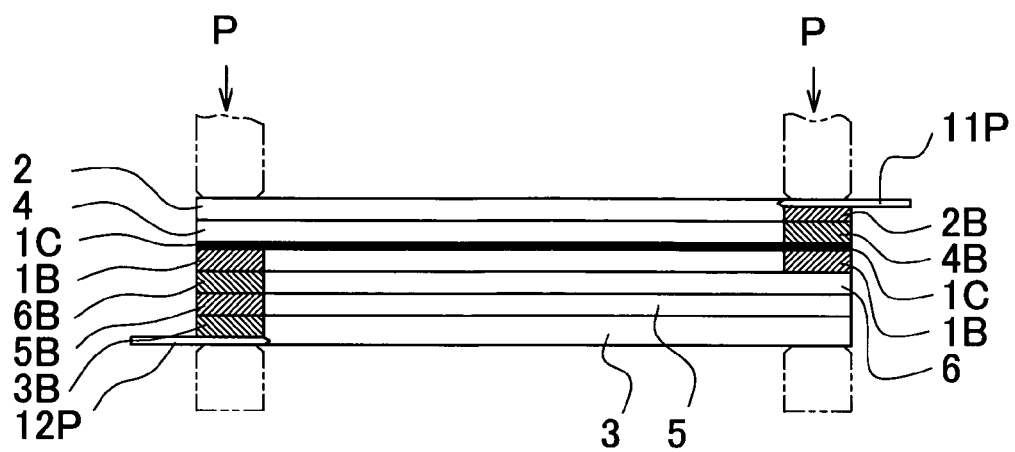
FIG. 4A is a vertical section of the connecting sheet shown in FIG. 2.
Figure 4B:
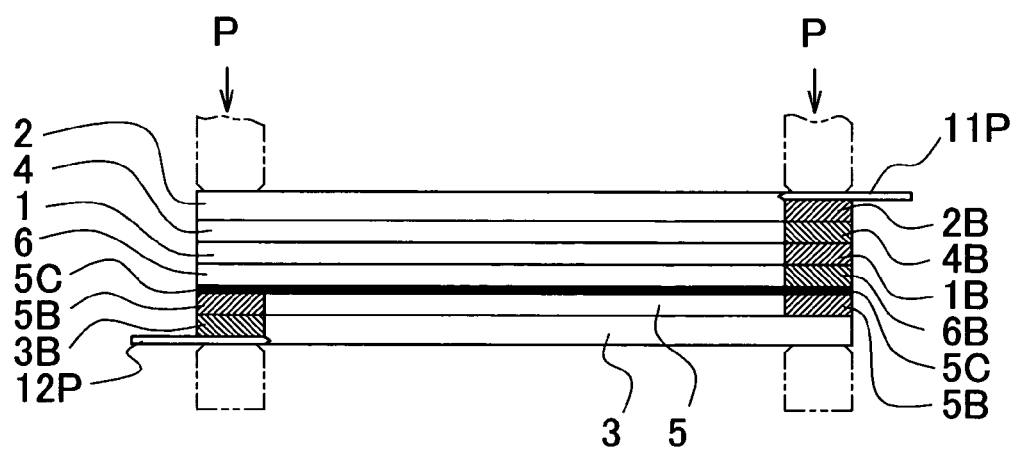
FIG. 4B is a vertical section of the connecting sheet shown in FIG. 2.

Next, operation of the connecting sheet 100 shown in FIG. 2 is explained referring to FIG. 4. FIG. 4A is a vertical section cut through the connecting sheet 100 along the first high speed transmission lines 1C of the first high speed transmission line board 1, and FIG. 4B is a vertical section cut through the connecting sheet 100 along the second high speed transmission lines 5C of the second high speed transmission line board 5. In FIG. 4A and FIG. 4B, joining is carried out in advance by electrically conductive adhesive between each elastomer, which is conductive, forming the electromagnetic shielding wall for each of the high speed transmission lines, and between the ground boards 5G and each elastomer, which is conductive.

FIG. 4A shows a state in which the plug pins 11P that are in contact with the second elastomer strips 2B at positions associated with the first high speed transmission lines 1C (for example, at the left side of FIG. 2), and the plug pins 12P that are in contact with the third elastomer strips 3B, are connected with the first high speed transmission lines 1C. As shown in FIG. 4A, the plug pins 11P, that form plural external connecting terminals, are disposed at one edge of the connecting sheet 100 composed of the multilayer board, and plural external connecting terminals 12P are disposed at the other edge of the connecting sheet 100. When the plug pins 11P and 12P are pushed against the first surface layer board 2 in a direction shown by an arrow P, and when the other edge of the first surface layer board 2 is pressed in the direction P, the plug pins 11P and 12P are connected to the plural first high speed transmission lines 1C, by a first path composed of: one of the external connecting terminals 11P, the second elastomer strips 2B, the fourth elastomer strips 4B, the first high speed transmission lines 1C, the first elastomer strips 1B, the sixth elastomer strips 6B, the fifth elastomer strips 5B, and the third elastomer strips 3B.

FIG. 4B shows a state in which the plug pins 11P that are in contact with the second elastomer strips 2B at positions associated with the second high speed transmission lines 5C (for example, the third and the fourth pin from the left side of FIG. 2) and the plug pins 12P that are in contact with the third elastomer strips 3B are connected with the second high speed transmission lines 5C. In this case also, when the plug pins 11P are pushed against the first surface layer board 2 in the direction P, and the other edge of the first surface layer board 2 is pressed in the direction P, the plug pins 11P and 12P are connected to the plural second high speed transmission lines 5C, by a second path composed of: one of the external connecting terminals 11P, the second elastomer strips 2B, the fourth elastomer strips 4B, the first elastomer strips 1B, the sixth elastomer strips 6B, the second high speed transmission lines 5C, the fifth elastomer strips 5B, and the third elastomer strips 3B.

Furthermore, in FIG. 4A, it is preferable that there is no signal reflection where the sixth elastomer strips 6B, the fifth elastomer strips 5B, and the third elastomer strips 3B, each of which are conductive, are disposed, below the first elastomer strips 1B at one edge (the left side edge in the figure) of the connecting sheet 100, and it is preferable that the configuration be of members formed of a nonconductive elastomer or of an elastomer sheet having a fixed dielectric constant, forming the various substrates.

In the same way, in FIG. 4B, it is preferable that there is no signal reflection where the sixth elastomer strips 6B, the first elastomer strips 1B, and the fourth elastomer strips 4B, each of which are conductive, are disposed, above the fifth elastomer strips 5B at the other edge (the right side edge in the figure) of the connecting sheet 100, and it is preferable that the configuration be of members formed of a nonconductive elastomer or of an elastomer sheet having a fixed dielectric constant, forming the various substrates.

In the connecting sheet having this type of connecting structure for the external connecting terminals, since surface contact is implemented so that the external connecting terminals are firmly attached to plural elastomer strips that are conductive and that form the edge connectors, there is no air layer between the external connecting terminals and the edge connectors, and reflection of high speed signals at connecting ends of the external connecting terminals does not easily occur.

In the connecting sheet having this type of inter-layer connecting structure, solely by pressing members together, without a via being provided, the high speed transmission lines can be connected to front layer patterns. In addition, if a nonconductive elastomer sheet is laminated on the face below the high speed transmission lines, since it is not necessary to provide a via penetrating in the direction of thickness of the board, as was done conventionally, there is an advantage in that signal reflection in the direction of thickness of the board does not easily occur. There is also an advantage in that with the conductive elastomer strips that form edge connectors, instead of vias, equivalence to striplines in a vertical direction (direction of thickness) can be assured.

Moreover, in this type of connecting sheet, since the high speed transmission lines are electromagnetically shielded in three dimensions as if framed by the conductive elastomers and the ground boards, crosstalk between the high speed transmission lines can assuredly be prevented.

By appropriately combining, in accordance with an intended purpose and objective, the configuration and layout of the connecting sheet 100 composed of the multilayer board 100A according to the first embodiment shown in FIG. 1, a desired connecting sheet, as a modified example of the first embodiment, can be obtained as below.

As a first modified example, the connecting sheet composed of the multilayer board in which the first surface layer board, the first high speed transmission line board, and the ground board are laminated, in that order, is cited. Specifically, the connecting sheet is provided with the first high speed transmission line board having the stripline structure, that includes the first elastomer sheet that has a fixed dielectric constant, the plural first elastomer strips which are conductive between front and back surfaces and which are arrayed at two edges of the first elastomer sheet, and the plural first high speed transmission lines formed in a pattern on the first elastomer sheet and connecting two ends of the plural first elastomer strips; and the first surface layer board composed of the second elastomer sheet which is nonconductive, and the plural second elastomer strips which are conductive between front and back surfaces and which are arrayed in association with the plural first elastomer strips, at two edges of the second elastomer sheet.

In the connecting sheet in the first modified example, one face of the first high speed transmission line board (the face on which the high speed transmission lines are not formed) is laminated so as to face a ground board, and the first surface layer board is laminated on the other face of the first high speed transmission line board, to form the multilayer board. According to the first modified example, the plural first high speed transmission lines 1C arrayed at regular intervals are formed in a pattern on the first high speed transmission line board. The first surface layer board, the first high speed transmission line board, and the ground board of the first modified example have a configuration that is much the same as that used in the first embodiment, but the first elastomer that forms the plural ground layers that are conductive between front and back surfaces is not arrayed on the first high speed transmission line board.

In this type of connecting sheet according to the first modified example, the external connecting terminals are in pressurized contact with the plural second elastomer strips formed at two edges of the first surface layer board, and the external connecting terminals and the plural first high speed transmission lines are connected. This type of connecting sheet according to the first modified example is a preferred connecting sheet that is inexpensive in cases in which it is not necessary to rigorously prevent crosstalk between transmission signals.

In a preferable connecting sheet according to a second modified example, the first surface layer board, the first high speed transmission line board, the ground board, and the second surface layer board are laminated, in that order, to form the multilayer board. Specifically, the connecting sheet is provided with the first high speed transmission line board having the stripline structure, that is composed of: the first elastomer sheet that has a fixed dielectric constant, the plural first elastomer strips that are conductive between front and back surfaces, and that are arrayed at two edges of the first elastomer sheet, and the plural first high speed transmission lines formed in a pattern on the first elastomer sheet 1A and connecting two ends of the plural first elastomer strips; the first surface layer board composed of the second elastomer sheet that is nonconductive, and the plural second elastomer strips that are conductive between front and back surfaces and that are arrayed in association with the plural first elastomer strips, at one edge of the second elastomer sheet; and the second surface layer board composed of the third elastomer sheet that is nonconductive, and the plural third elastomer strips that are conductive between front and back surfaces, and that are arrayed in association with the plural first elastomer strips at the other edge of the third elastomer sheet.

In the preferable connecting sheet according to the second modified example, the second surface layer board is laminated on one face of the ground board, one face of the first high speed transmission line board (the face on which the high speed transmission lines are not provided) is laminated on the other face of the ground board 5G, and the first surface layer board is laminated on the other face of the first high speed transmission line board, to form the multilayer board. In the preferable connecting sheet according to the second modified example, with the first high speed transmission line board as a core board, the first surface layer board and the second surface layer board are laminated opposite each other, sandwiching the first restraining transmission line board, to form the multilayer board. According to the second modified example, the plural first high speed transmission lines arrayed at regular intervals are formed in a pattern on the first high speed transmission line board. The first high speed transmission line board, the ground layer, and the second surface layer board of the second modified example have a configuration that is much the same as that used in the first embodiment, but according to a second embodiment, the first elastomer that forms plural ground layers that are conductive between front and back surfaces is not arrayed on the first high speed transmission line board.

In this type of connecting sheet according to the second modified example, one external connecting terminal is in pressurized contact with the plural second elastomer strips formed at one edge of the first surface layer board, the other external connecting terminal is in pressurized contact with the plural third elastomer strips formed at the other edge of the second surface layer board, and the external connecting terminals and the plural first high speed transmission lines are connected. This type of connecting sheet according to the second embodiment is a preferred connecting sheet that is inexpensive in cases in which it is not necessary to rigorously prevent crosstalk between transmission signals.

In a preferable connecting sheet according to a third modified example, the first surface layer board, the second ground board, the first inner layer board, the first high speed transmission line board, and the first ground board are laminated, in that order, to form the multilayer board. Specifically, the connecting sheet is provided with the first high speed transmission line board having the stripline structure, that is composed of the first elastomer sheet that has a fixed dielectric constant, the plural first elastomer strips that are conductive between front and back surfaces and that are arrayed at two edges of the first elastomer sheet, the plural first high speed transmission lines formed in a pattern on the first elastomer sheet and connecting two ends of the plural first elastomer strips, and the first elastomer that forms the plural ground layers that are conductive between front and back surfaces and that are arrayed in parallel to the first high speed transmission lines so as to sandwich the first high speed transmission lines.

Furthermore, a preferable connecting sheet according to the third modified example is provided with the first surface layer board that is composed of the second elastomer sheet that is nonconductive, and the plural second elastomer strips that are conductive between front and back surfaces and that are arrayed in association with the plural first elastomer strips at two edges of the second elastomer sheet. Also provided are: the first inner layer board that is composed of the fourth elastomer sheet that is nonconductive, the plural fourth elastomer strips that are conductive between front and back surfaces and that are arrayed in association with the plural first elastomer strips at two edges of the fourth elastomer sheet, and the second elastomer that forms the plural ground layers that are conductive between front and back surfaces and that are arrayed in association with the first elastomer that forms the plural ground layers, and two ground boards that have a least a width in contact with the first elastomer forming the plural ground layers.

In a preferable connecting sheet according to the third modified example, the first ground board, the first high speed transmission line board, the first inner layer board, and the second ground board, are laminated, in that order, to form an offset stripline structure, and the first surface layer board is further laminated on the second ground board of the laminated boards of the offset stripline structure, to form the multilayer board.

In this type of connecting sheet according to the third modified example, the external connecting terminals are in pressurized contact with the plural second elastomer strips formed at two edges of the first surface layer board, and the external connecting terminals and the plural first high speed transmission lines are connected. Furthermore, by the faces of the multilayer board being pressed together, the electromagnetic shielding wall is formed between the plural first high speed transmission lines. This type of connecting sheet according to the third modified example has a single layer offset stripline structure, and is a preferable connecting sheet in which crosstalk between transmission signals can be rigorously prevented. Moreover, members forming the connecting sheet in the third modified example have a configuration similar to that used in the first embodiment.

In a preferable connecting sheet according to a fourth modified example, the laminated members of the connecting sheet according to the third modified example are joined by an electrically conductive adhesive. That is, the connecting sheet is provided with the multilayer board configured from an offset stripline structure in which the second ground board, the first high speed transmission line board, the first inner layer board 4, and the first ground board are laminated, in that order, and the first surface layer board is further laminated on the offset stripline structure.

In the connecting sheet according to the fourth modified example, by respectively joining, with electrically conductive adhesive, the first ground board and the first elastomer of the first high speed transmission line board, the first elastomer and the second elastomer of the first inner layer board, and the second elastomer and the second ground board, the electromagnetic shielding wall is formed in three dimensions between the plural first high speed transmission lines.

A preferable connecting sheet according to a fifth modified example is configured by further laminating the second surface layer board in the multilayer board of the connecting sheet in the third modified example. Specifically, the connecting sheet is provided with the first high speed transmission line board having the stripline structure, that is composed of the first elastomer sheet that has a fixed dielectric constant, the plural first elastomer strips that are conductive between front and back surfaces and that are arrayed at two edges of the first elastomer sheet, the plural first high speed transmission lines formed in a pattern on the first elastomer sheet and connecting two ends of the plural first elastomer strips, and the first elastomer that forms the plural ground layers that are conductive between front and back surfaces and that are arrayed in parallel to the first high speed transmission lines so as to sandwich the first high speed transmission lines 1C.

Furthermore, the preferable connecting sheet according to the fifth modified example is provided with the first surface layer board that is composed of the second elastomer sheet that is nonconductive, and the plural second elastomer strips that are conductive between front and back surfaces and that are arrayed in association with the plural first elastomer strips at one edge of the second elastomer sheet. In addition, the second surface layer board is provided, having the third elastomer sheet, that is nonconductive, and the plural third elastomer strips that are conductive between front and back surfaces and that are arrayed in association with plural first elastomers at the other edge of the third elastomer sheet.

Furthermore, the preferable connecting sheet according to the fifth modified example is provided with: the first inner layer board that is composed of the fourth elastomer sheet that is nonconductive, the plural fourth elastomer strips that are conductive between front and back surfaces and that are arrayed in association with the plural first elastomer strips at two edges of the fourth elastomer sheet, and the second elastomer that forms the plural ground layers that are conductive between front and back surfaces and that are arrayed in association with the first elastomer that forms the plural ground layers; and the plural ground boards that have at least a width in contact with the first elastomer that forms the plural ground layers.

In the preferable connecting sheet according to the fifth modified example, the first ground board, the first high speed transmission line board, the first inner layer board, and the second ground board are laminated, in that order, to form an offset stripline structure, and the first surface layer board and the second surface layer board are further laminated on the two faces of the laminated boards of the offset stripline structure, to form the multilayer board. The second surface layer board has the same configuration as that of the first embodiment.

In this type of connecting sheet according to the fifth modified example, one external connecting terminal is in pressurized contact with the plural second elastomer strips formed at one edge of the first surface layer board, the other external connecting terminal is in pressurized contact with the plural third elastomer strips formed at the other edge of the second surface layer board, and the external connecting terminals and the plural first high speed transmission lines are connected.

Furthermore, by the faces of the multilayer board being pressed together, the electromagnetic shielding wall is formed in three dimensions between the plural first high speed transmission lines. This type of connecting sheet according to the fifth modified example has a single layer offset stripline structure and is a preferable connecting sheet in which crosstalk between transmission signals can be rigorously prevented.

In a preferable connecting sheet according to a sixth modified example, the laminated members of the connecting sheet according to the fifth modified example are joined by electrically conductive adhesive. That is, the connecting sheet is provided with the multilayer board configured from an offset stripline structure in which the first ground board, the first high speed transmission line board, the first inner layer board, and the second ground board are laminated, in that order, and the first surface layer board and the second surface layer board are further laminated on the two faces of the offset stripline structure.

In the connecting sheet according to the sixth modified example, by respectively joining, with electrically conductive adhesive, the first ground board and the first elastomer, the first elastomer and the second elastomer, and the second elastomer and the second ground board, the electromagnetic shielding wall is formed in three dimensions between the plural first high speed transmission lines.

The connecting sheet 100 explained referring to FIGS. 1 to 4 may be configured by further laminating boards to the modified examples. The connecting sheet 100 is composed of the multilayer board having a two-layer offset stripline structure, with the second surface layer board 3, the third ground board 5G$_3$, the second high speed transmission line board 5, the second inner layer board 6, the first ground board 5G$_1$, the first high speed transmission line board 1, the first inner layer board 4, the second ground board 5G$_2$, and the first surface layer board 2 laminated, in that order, and the external connecting terminals are in pressurized contact with the plural second elastomer strips 2B formed at two edges of the first surface layer board 2 in the multilayer board, so that the external connecting terminals are connected to the plural first high speed transmission lines 1C and the plural second high speed transmission lines 5C.

In the connecting sheet according to a seventh modified example, with regard to the connecting sheet 100 of the first embodiment, the second elastomer strips 2B are only provided on at least one edge of the first surface layer board 2, and the third elastomer strips 3B are only provided on at least one of the second surface layer board 3. Specifically, the connecting sheet is composed of the multilayer board having a two layer offset stripline structure, in which the second surface layer board, the third ground board, the second high speed transmission line board, the second inner layer board, the first ground board, the first high speed transmission line board, the first inner layer board, the second ground board, and the first surface layer board are laminated, in that order.

In the connecting sheet according to the seventh modified example, one external connecting terminal is in pressurized contact with the plural second elastomer strips formed at one edge of the first surface layer board in the multilayer board, the other external connecting terminal is in pressurized contact with the plural third elastomer strips formed at the other edge of the second surface layer board on the multilayer board, and the external connecting terminals are connected to the plural first high speed transmission lines and the plural second high speed transmission lines.

Furthermore, as another modified example, in the connecting sheet in the seventh modified example, by respectively joining, with electrically conductive adhesive, the third ground board and the third elastomer, the third elastomer and the fourth elastomer, and the fourth elastomer and the first ground board, as shown in FIG. 1, the electromagnetic shielding wall is formed in three dimensions between the plural second high speed transmission lines.

Figure 5:
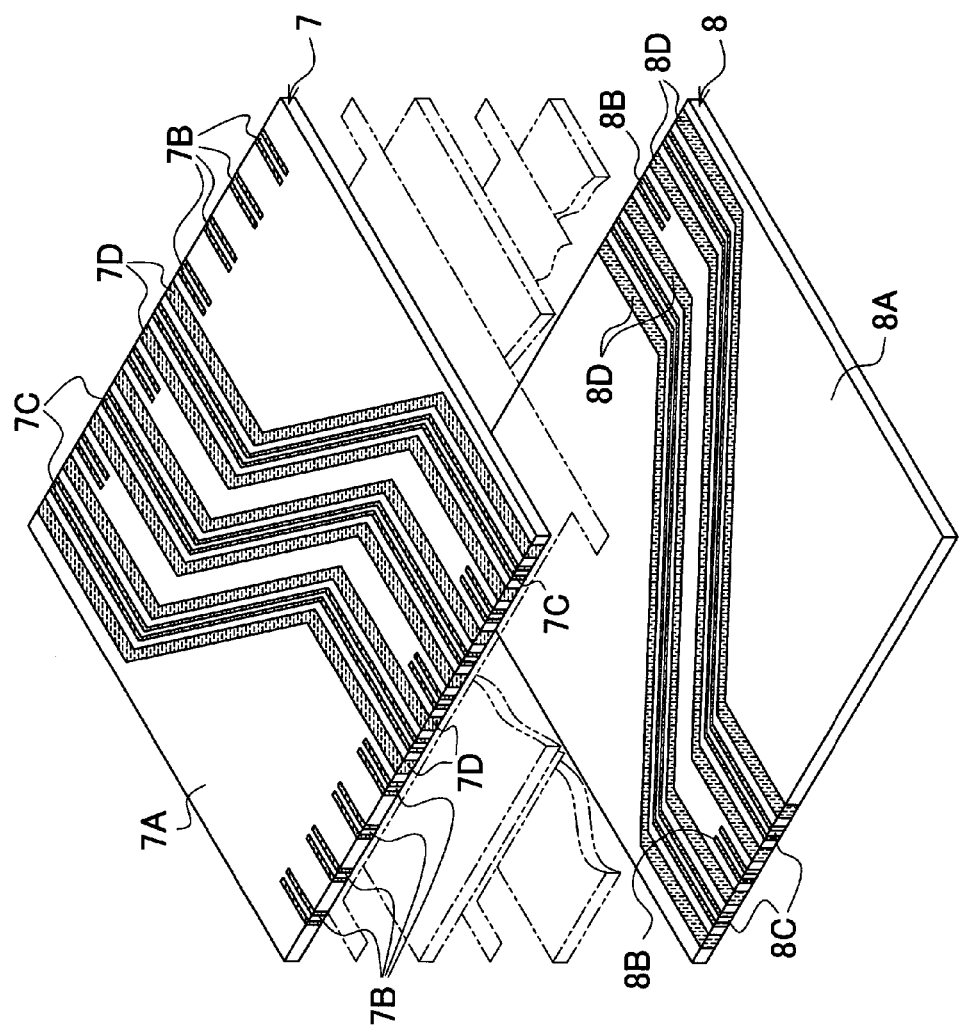
FIG. 5 is a perspective exploded view showing a partial configuration of a connecting sheet in a second embodiment of the present invention.

Next, the second embodiment of a connecting sheet according to the present invention is explained, referring to FIG. 5. FIG. 5 is a perspective exploded view showing a partial configuration of a connecting sheet 200 in the second embodiment. In FIG. 5, reference symbol 7 denotes a first high speed transmission line board, and reference symbol 8 denotes a second high speed transmission line board.

In the second embodiment in FIG. 5, the main portion of the first high speed transmission line board 7 is formed of a first elastomer sheet 7A, in which an elastomer that has a fixed dielectric constant is formed in an approximately rectangularly shaped sheet. At two edges of the first elastomer sheet 7A that forms a substrate of the first high speed transmission line board 7, plural first elastomer strips 7B, that are conductive between front and back surfaces, are arrayed so as to face each other. The first elastomer strips 7B that are conductive are composed of a material in which electrically conductive particles are mixed into silicone rubber. At two edges of the first high speed transmission line board 7, the first elastomer sheet 7A and the first elastomer strips 7B are arrayed alternately, to form an anisotropic conductive sheet.

Plural first high speed transmission lines 7C are formed in a pattern on the surface of the first elastomer sheet 7A, and the plural first high speed transmission lines 7C connect, as desired, the two ends of the plural first elastomer strips 7B. Here, "as desired" means that the first elastomer strips 7B, formed at a pair of opposing edges on the first elastomer sheet 7A, are not connected in a straight line. In the embodiment in FIG. 5, the plural first high speed transmission lines 7C are composed of differential signal paths that form pairs. On the back face of the first elastomer sheet 7A facing the plural first high speed transmission lines 7C, a first ground board 7G$_1$, described below, is laminated, and the first high speed transmission line board 7 has a stripline structure.

Furthermore, in the first high speed transmission line board 7, a first elastomer 7D, forming plural ground layers that are conductive between front and back surfaces, is disposed in parallel to the first high speed transmission lines 7C so as to sandwich the first high speed transmission lines 7C. The first elastomer 7D that is conductive is composed of a material in which electrically conductive particles are mixed into silicone rubber.

At edges of the first high speed transmission line board 7, the first elastomer sheet 7A having the fixed dielectric constant and the first elastomer 7D that forms the conductive ground layers are alternately arrayed, to form an anisotropic conductive sheet. The first elastomer sheet 7A and the first elastomer 7D are arrayed alternately and contiguously in a direction linking two ends of the plural first elastomer strips 7B.

In the same way, in the second embodiment in FIG. 5, the main portion of the second high speed transmission line board 8 is composed of a fifth elastomer sheet 8A in which an elastomer that has a fixed dielectric constant is formed in an approximately rectangularly shaped sheet. At two edges of the fifth elastomer sheet 8A that forms a substrate of the second high speed transmission line board 8, plural fifth elastomer strips 8B that are conductive between front and back surfaces, are arrayed so as to face each other. The fifth elastomer strips 8B that are conductive are composed of a material in which electrically conductive particles are mixed into silicone rubber. At two edges of the second high speed transmission line board 8, the fifth elastomer sheet 8A and the fifth elastomer strips 8B are arrayed alternately, to form an anisotropic conductive sheet.

Plural second high speed transmission lines 8C are formed in a pattern on the front surface of the fifth elastomer sheet 8A, and the plural second high speed transmission lines 8C connect, as desired, the two ends of the plural fifth elastomer strips 8B. In the embodiment in FIG. 5, the plural second high speed transmission lines 8C are composed of differential signal paths that form pairs. On the back surface of the fifth elastomer sheet 8A that faces the plural second high speed transmission lines 8C, ground boards 7G, described below, are laminated, and the second high speed transmission line board 8 has a stripline structure.

Furthermore, in the second high speed transmission line board 8, a third elastomer 8D, forming plural ground layers that are conductive between front and back surfaces, is disposed in parallel to the second high speed transmission lines 8C so as to sandwich the second high speed transmission lines 8C. The third elastomer 8D, which is conductive, is composed of a material in which electrically conductive particles are mixed into silicone rubber.

In the second high speed transmission line board 8, the fifth elastomer sheet 8A that has a fixed dielectric constant, and the third elastomer 8D, which forms the conductive ground layers, are alternately arrayed, to form an anisotropic conductive sheet. The fifth elastomer sheet 8A and the third elastomer 8D are arrayed alternately and contiguously in a direction linking two ends of the plural fifth elastomer strips 8B.

Figure 6:
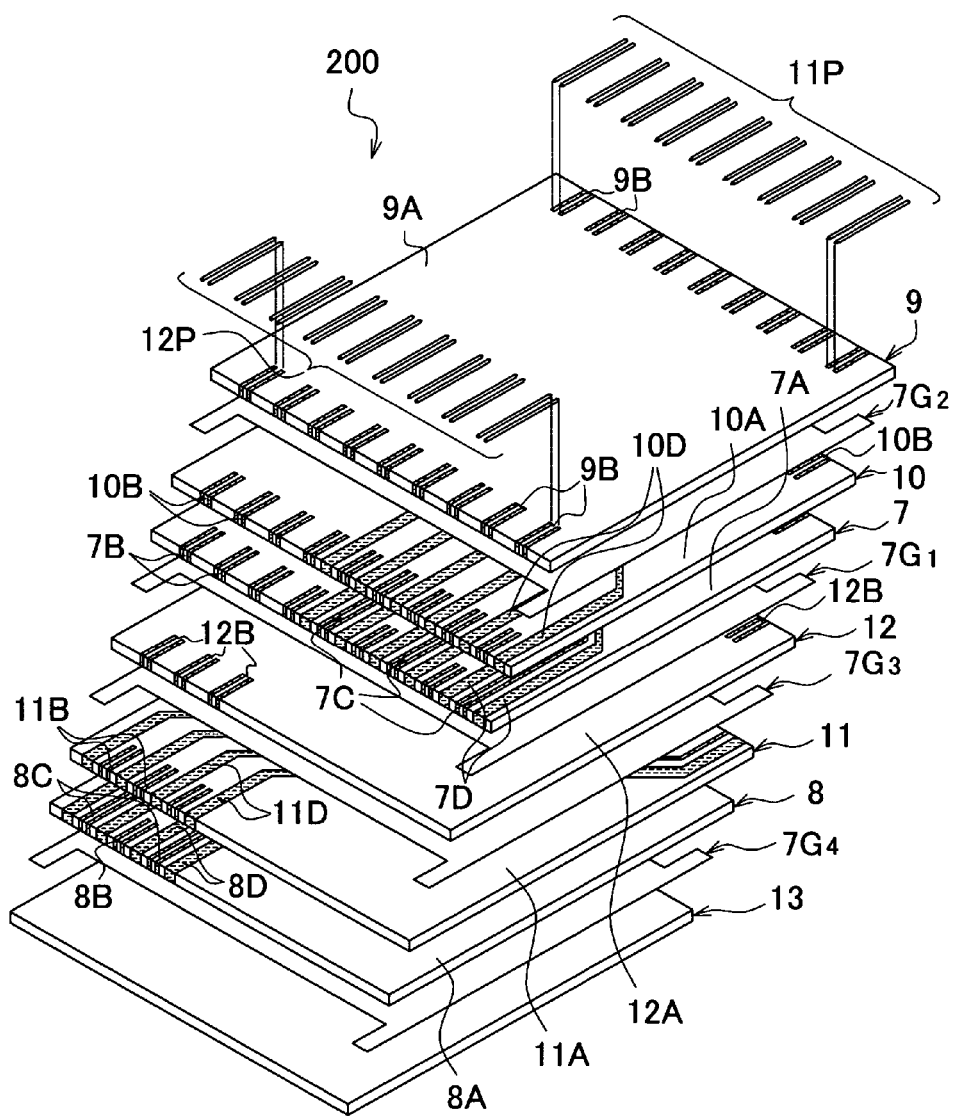
FIG. 6 is a perspective exploded view showing a configuration of a connecting sheet in the second embodiment of the present invention.

Next, an overall configuration including the first high speed transmission line board 7 and the second high speed transmission line board 8 are explained according to FIG. 6. FIG. 6 is a perspective exploded view showing a configuration of the connecting sheet 200 in the second embodiment of the present invention. In FIG. 6, reference symbol 9 denotes a first surface layer board, reference symbol 10 denotes a first inner layer board, reference symbol 11 denotes a second inner layer board, and reference symbol 12 denotes a third inner layer board. Moreover, reference symbol 13 denotes a bottom sheet, and reference symbol 7G denotes ground boards. Four ground boards G are provided, respectively denoted as a first ground board 7$G_1$, a second ground board 7$G_2$, a third ground board 7$G_3$, and a fourth ground board 7$G_4$.

In the second embodiment in FIG. 6, the main portion of the first surface layer board 9 is formed of a second elastomer sheet 9A, in which an elastomer that is nonconductive is formed in an approximately rectangularly shaped sheet. At two edges of the second elastomer sheet 9A that forms a substrate of the first surface layer board 9, plural second elastomer strips 9B, which are conductive between front and back surfaces, are arrayed so as be facing each other. The plural second elastomer strips 9B, which are conductive, are arrayed in association with the plural first elastomer strips 7B. In the second elastomer strips 9B, which are conductive, electrically conductive particles are mixed in with an elastomer that is relatively flexible. At two edges of the first surface layer board 9, the second elastomer sheet 9A, which is nonconductive, and the second elastomer strips 9B, which are conductive, are arrayed alternately, to form an anisotropic conductive sheet.

In the second embodiment in FIG. 6, the main portion of the first inner layer board 10 is formed of a fourth elastomer sheet 10A, in which an elastomer that is nonconductive is formed in an approximately rectangularly shaped sheet. At two edges of the fourth elastomer sheet 10A that forms a substrate of the first inner layer board 10, plural fourth elastomer strips 10B, which are conductive between front and back surfaces, are arrayed so as be facing each other. The fourth elastomer strips 10B, which are conductive, are composed of a material in which electrically conductive particles are mixed into silicone rubber. At two edges of the first inner layer board 10, the fourth elastomer sheet 10A and the fourth elastomer strips 10B are arrayed alternately, to form an anisotropic conductive sheet.

The plural fourth elastomer strips 10B are arrayed in association with the plural first elastomer strips 7B. Furthermore, on the first inner layer board 10, a second elastomer 10D that forms plural ground layers that are conductive between front and back surfaces, is disposed in association with the first elastomer 7D that forms the plural ground layers. The second elastomer 10D, which is conductive, is composed of a material in which electrically conductive particles are mixed into silicone rubber.

In the first inner layer board 10, the fourth elastomer sheet 10A, which is nonconductive, and the second elastomer 10D, forming the ground layers that are conductive, are arrayed alternately, to form an anisotropic sheet. The fourth elastomer sheet 10A and the fourth elastomer 10D are arrayed alternately and contiguously in a direction linking two ends of the plural fourth elastomer strips 10B.

In the second embodiment in FIG. 6, the main portion of the second inner layer board 11 is formed of a sixth elastomer sheet 11A, in which an elastomer that is nonconductive is formed in an approximately rectangularly shaped sheet. At two edges of the sixth elastomer sheet 11A that forms a substrate of the second inner layer board 11, plural sixth elastomer strips 11B, which are conductive between front and back surfaces, are arrayed so as be facing each other. The sixth elastomer strips 11B, which are conductive, are composed of a material in which electrically conductive particles are mixed into silicone rubber. At two edges of the second inner layer board 11, the sixth elastomer sheet 11A and the sixth elastomer strips 11B are arrayed alternately, to form an anisotropic conductive sheet.

In the second embodiment in FIG. 6, at positions below the first elastomer strips 7B that form connection ends of the first high speed transmission lines 7C on the first high speed transmission line board 7, the sixth elastomer strips 11B of the second inner layer board 11 are not arrayed, and the sixth elastomer sheet 11A that is a substrate of the second inner layer board 11 closes the connection up.

Moreover, the plural sixth elastomer strips 11B are arrayed in association with the plural fifth elastomer strips 8B. Furthermore, on the second inner layer board 11, a fourth elastomer 11D, forming plural ground layers that are conductive between front and back surfaces, is disposed in association with the second elastomer 8D that forms the plural ground layers. The fourth elastomer 11D, which is conductive, is composed of a material in which electrically conductive particles are mixed into silicone rubber.

In the second embodiment in FIG. 6, the main portion of the third inner layer board 12 is formed of a seventh elastomer sheet 12A, in which an elastomer that is nonconductive is formed in an approximately rectangularly shaped sheet. At two edges of the seventh elastomer sheet 12A that forms a substrate of the third inner layer board 12, plural seventh elastomer strips 12B, which are conductive between front and back surfaces, are arrayed so as to be facing each other. The seventh elastomer strips 12B, which are conductive, are composed of a material in which electrically conductive particles are mixed into silicone rubber. At two edges of the third inner layer board 12, the seventh elastomer sheet 12A and the seventh elastomer strips 12B are arrayed alternately, to form an anisotropic conductive sheet. The seventh elastomer strips 12B are arrayed in association with the fifth elastomer strips 8B.

In the second embodiment in FIG. 6, the bottom sheet 13 is composed of the third elastomer sheet 13A that is nonconductive. Moreover, the ground boards 7G, formed of copper foil plating, have at least a width in contact with the first elastomer 7D forming the plural ground layers, and the second elastomer 8D forming the plural ground layers.

The connecting sheet 200 in the second embodiment configured in this way, as shown in FIG. 6, is composed of the multilayer board having a two-layer offset stripline structure in which the bottom sheet 13, the fourth ground board $7G_4$, the second high speed transmission line board 8, the second inner layer board 11, the third ground board $7G_3$, the third inner layer board 12, the first ground board $7G_1$, the first high speed transmission line board 7, the first inner layer board 10, the second ground board $7G_2$, and the first surface layer board 9 are laminated, in that order.

In the connecting sheet 200 configured as the multilayer board, as best shown in FIG. 5, the plural first high speed transmission lines 7C and the plural second high speed transmission lines 8C intersect three-dimensionally.

In the connecting sheet 200, the fourth ground board $7G_4$ and the third elastomer 8D, the third elastomer 8D and the fourth elastomer 11D, and the fourth elastomer 11D and the third ground board $7G_3$, may be respectively joined by an electrically conductive adhesive, and the second high speed transmission lines 8C may be electromagnetically shielded in three dimensions. In addition, the first ground board 7G, and the first elastomer 7D, the first elastomer 7D and the second elastomer 10D, and the second elastomer 10D and the second ground board $7G_2$, may be respectively joined by an electrically conductive adhesive, and the first high speed transmission lines 7C may be electromagnetically shielded in three dimensions.

Moreover, as shown in FIG. 6, plug pins 11P and 12P that form external connecting terminals are arrayed above two edges of the connecting sheet 200, and if the plug pins 11P and 12P that form the external connecting terminals are in pressurized contact with the plural elastomer strips 9B formed at two edges of the first surface layer board 9, the plural first high speed transmission lines 7C and the plural second high speed transmission lines 8C are connected to the plug pins 11P and 12P that form the external connecting terminals.

In this way, in the connecting sheet in which intersecting high speed transmission lines are connected in three dimensions in the multilayer board, since surface contact is implemented so that the external connecting terminals are firmly attached to plural elastomer strips that are conductive and form edge connectors, there is no air layer between the external connecting terminals and the edge connectors, and reflection of high speed signals at connecting ends of the external connecting terminals does not easily occur.

In the connecting sheet having this type of inter-layer connecting structure, solely by pressing members together, without a via being provided, the high speed transmission lines can be connected to surface layer patterns. In addition, if a nonconductive elastomer sheet is laminated on a surface below the high speed transmission lines, since there is no via penetrating in the direction of board thickness, as was done conventionally, there is an advantage in that signal reflection in the direction of board thickness does not easily occur. There is also an advantage in that with the conductive elastomer strips that form the edge connectors, instead of vias, equivalence to striplines in a vertical direction (direction of board thickness) can be assured.

Furthermore, in this type of connecting sheet, since the high speed transmission lines are electromagnetically shielded in three dimensions as if framed by the conductive elastomer and the ground boards, crosstalk between the high speed transmission lines can be more assuredly prevented.

Next, a method of manufacturing the first high speed transmission line board 1, best shown in FIG. 3, is explained below, with reference to the drawings.

Figure 7:
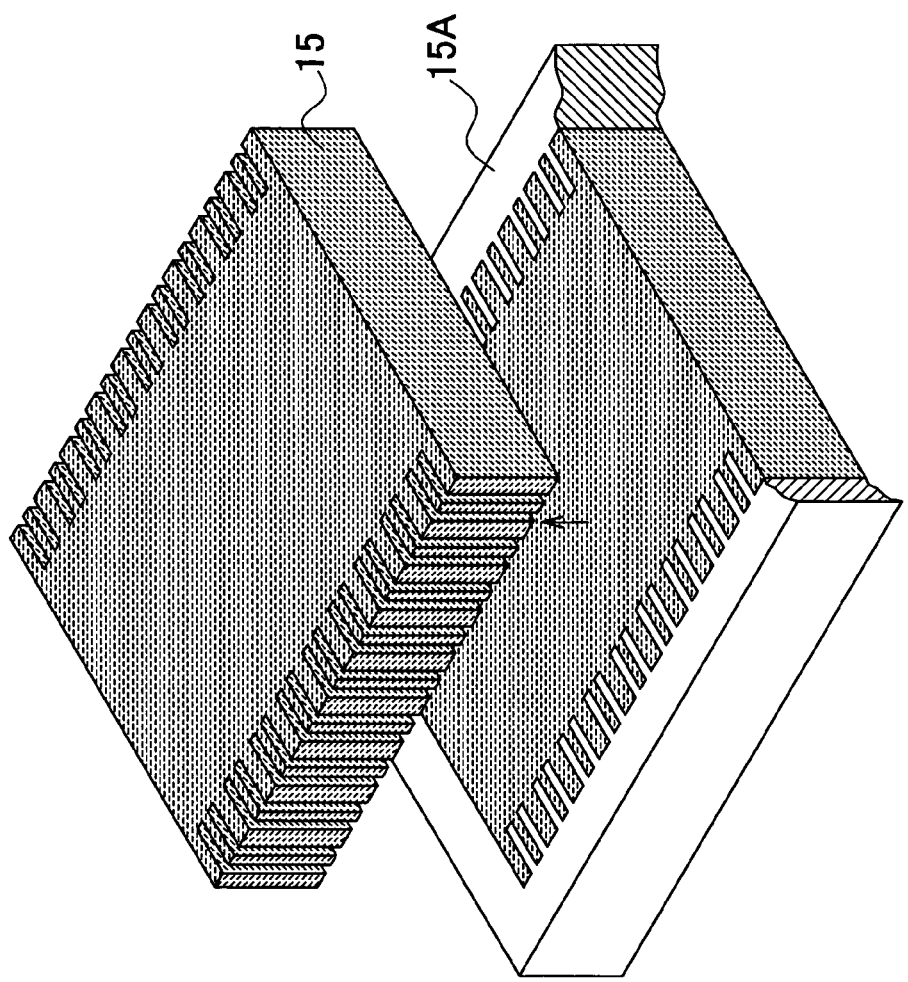
FIG. 7 is a perspective outline view of a dielectric block that is molded, related to a method for manufacturing a first high speed transmission line board in the first embodiment of the present invention.

In FIG. 7, a rectangular solid box form frame 15A is provided. In opposing inner walls of the form frame 15A, plate-type comb tooth protrusions are formed. Dielectric particles such as, for example, Teflon (registered trademark) particles, are kneaded into raw rubber, which is a common elastomer raw material, and additionally, compound rubber with a small amount of sulfur and assisting material added is inserted in the form frame 15A. Furthermore, after vulcanizing by heating, a dielectric block 15, having a fixed dielectric constant, is obtained. The dielectric block 15 in which comb tooth grooves are formed in opposing side walls is removed from the form frame 15A.

Figure 8:
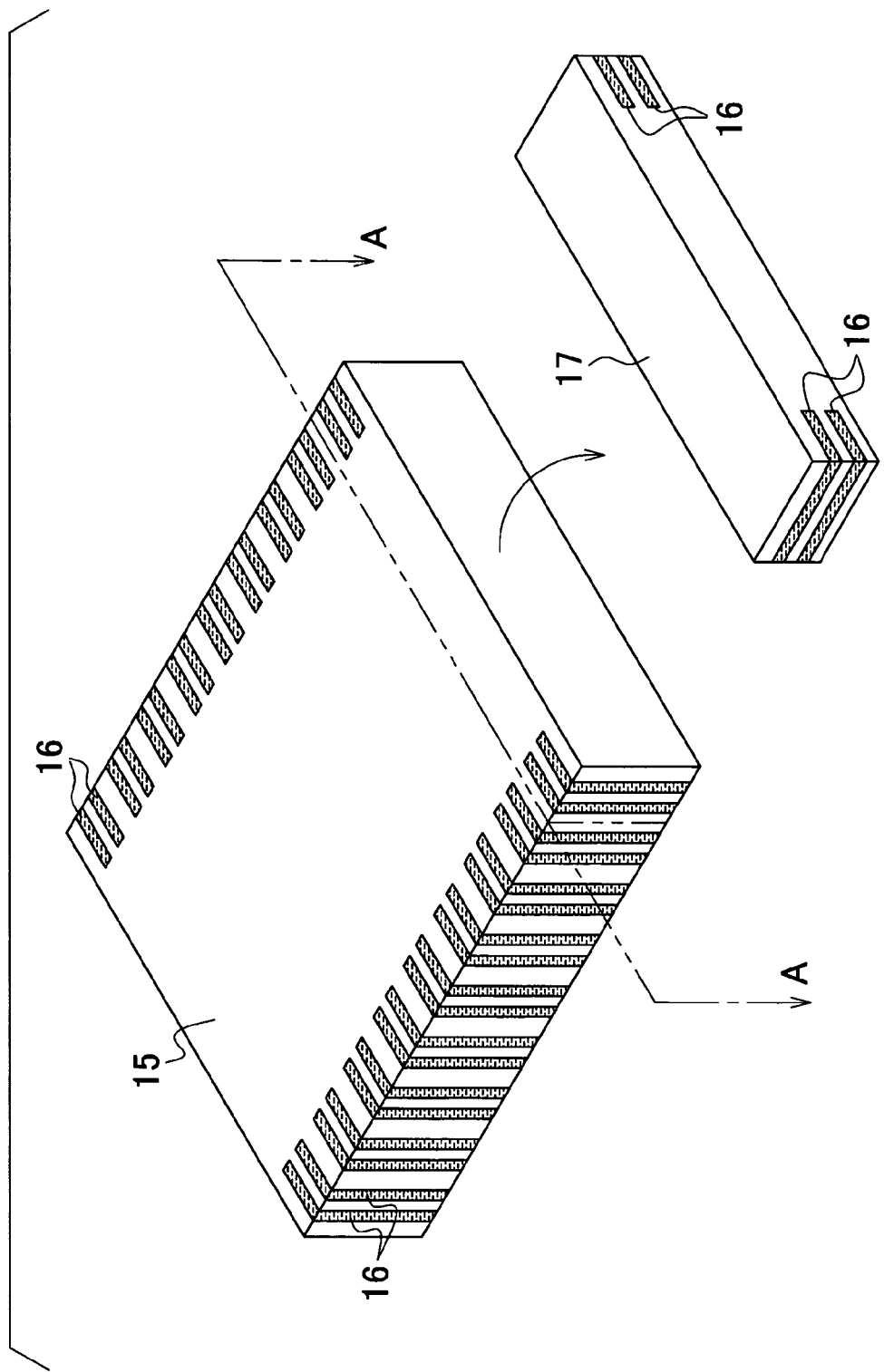
FIG. 8 is a cutting process view of an anisotropic conductive block in which the dielectric block and a conductive block are joined, related to the method for manufacturing the first high speed transmission line board in the first embodiment of the present invention.

Next, as shown in FIG. 8, the bottom face of the dielectric block 15 and the side walls, on which the comb tooth grooves are formed, are enclosed in a form frame, and unvulcanized conductive rubber, into which, as material that has conductivity, conductive material such as, for example, silver, is kneaded, is infused into raw rubber in the comb tooth grooves. The unvulcanized conductive rubber and the vulcanized dielectric block 15 are bonded by heating.

Next, as shown in FIG. 8, by cutting an anisotropic conductive block, in which the dielectric block 15 and conductive blocks 16 are joined, along a dashed section line A-A, an anisotropic conductive block 17 shown in FIG. 8 is obtained.

Cutting may be done with a blade, such as a hardened steel cutter or a ceramic cutter, a grindstone fine cutter, a saw, or with any other cutting device or cutting instrument (which may include a cutting device of a non-contact type, such as a laser cutter).

Figure 9:
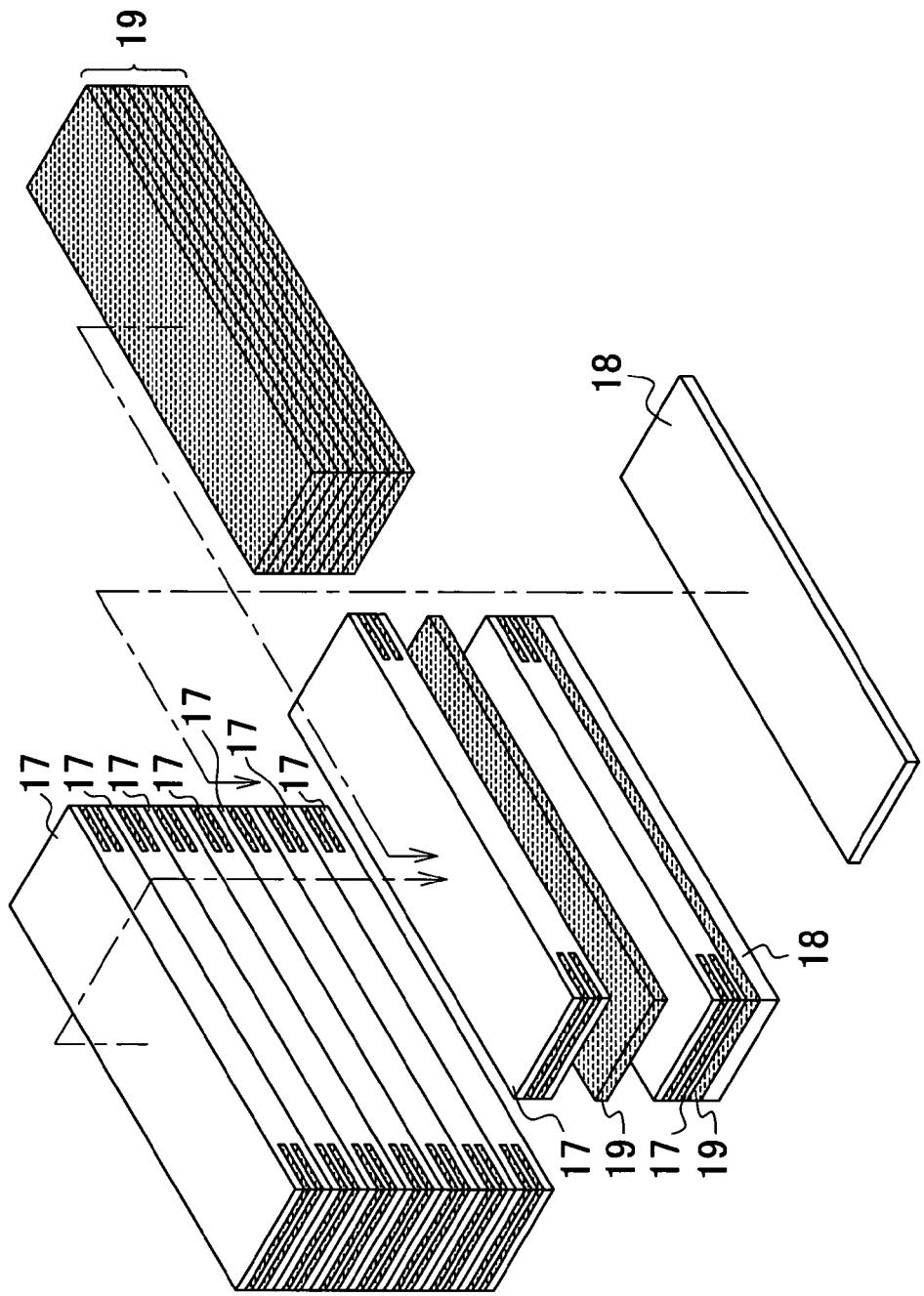
FIG. 9 shows a laminated body in which conductive elastomer sheets 19 are built up on a dielectric elastomer sheet and the anisotropic conductive block is additionally built up, related to the method for manufacturing the first high speed transmission line board in the first embodiment of the present invention.

Next, in FIG. 9, plural anisotropic conductive blocks 17, plural dielectric elastomer sheets 18 of a composition same as the dielectric block 15 shown in FIG. 7, and plural conductive elastomer sheets 19 are provided.

As shown in FIG. 9, the conductive elastomer sheets 19 are laminated on the dielectric elastomer sheets 18, and the anisotropic conductive blocks 17 are additionally laminated on top, to form a laminated body. With the width dimension and the length dimension the same in the anisotropic conductive blocks 17, the dielectric elastomer sheets 18 and the conductive elastomer sheets 19 are joined by applying a bonding agent between these members to produce the laminated body 20, which is explained next.

Figure 10:
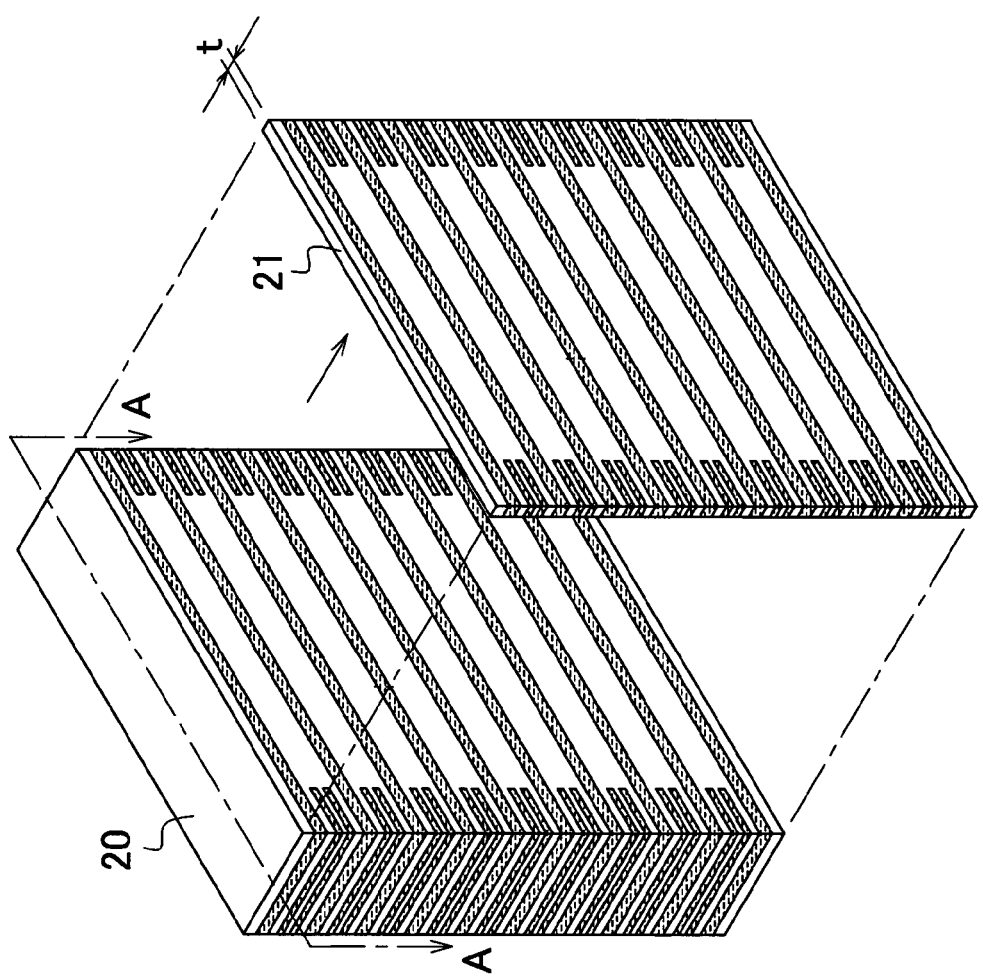
FIG. 10 is a process view for cutting the laminated body created according to a lamination process of FIG. 9, related to the method for manufacturing the first high speed transmission line board in the first embodiment of the present invention.

FIG. 10 shows a process for cutting the laminated body 20 produced by the abovementioned lamination process. The laminated body 20 is cut so that the board thickness of an obtained anisotropic conductive sheet 21 is a desired thickness. The anisotropic conductive sheet 21 is then produced. After copper foil is laminated and disposed on one surface of the anisotropic conductive sheet 21 produced in this way, the high speed transmission lines are formed in a pattern by a print etching method.

Figure 11:
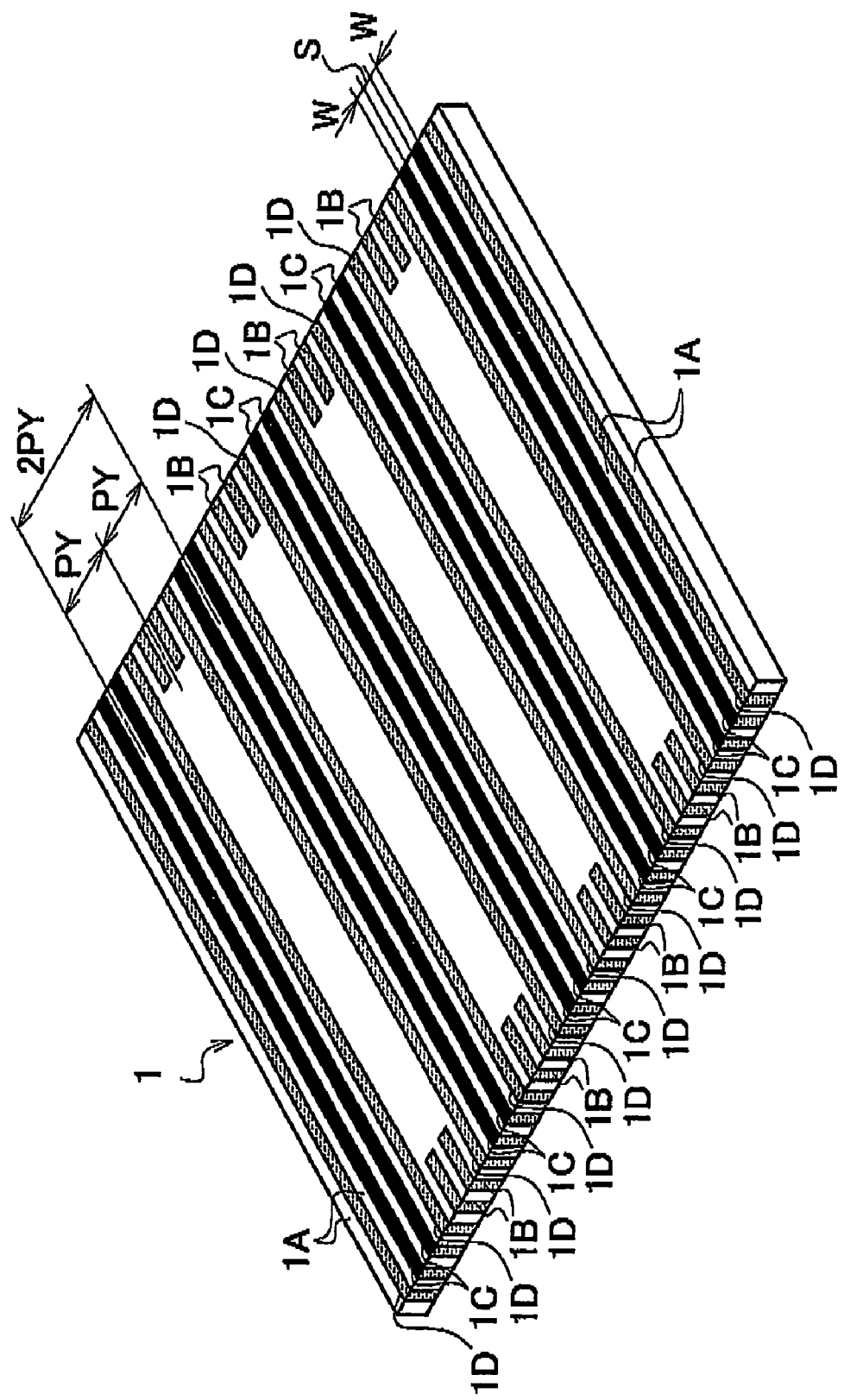
FIG. 11 is a perspective outline view of the first high speed transmission line board on which a pattern is formed on an anisotropic conductive sheet created according to the cutting process of FIG. 10, related to the method for manufacturing the first high speed transmission line board in the first embodiment of the present invention.
Figure 12:
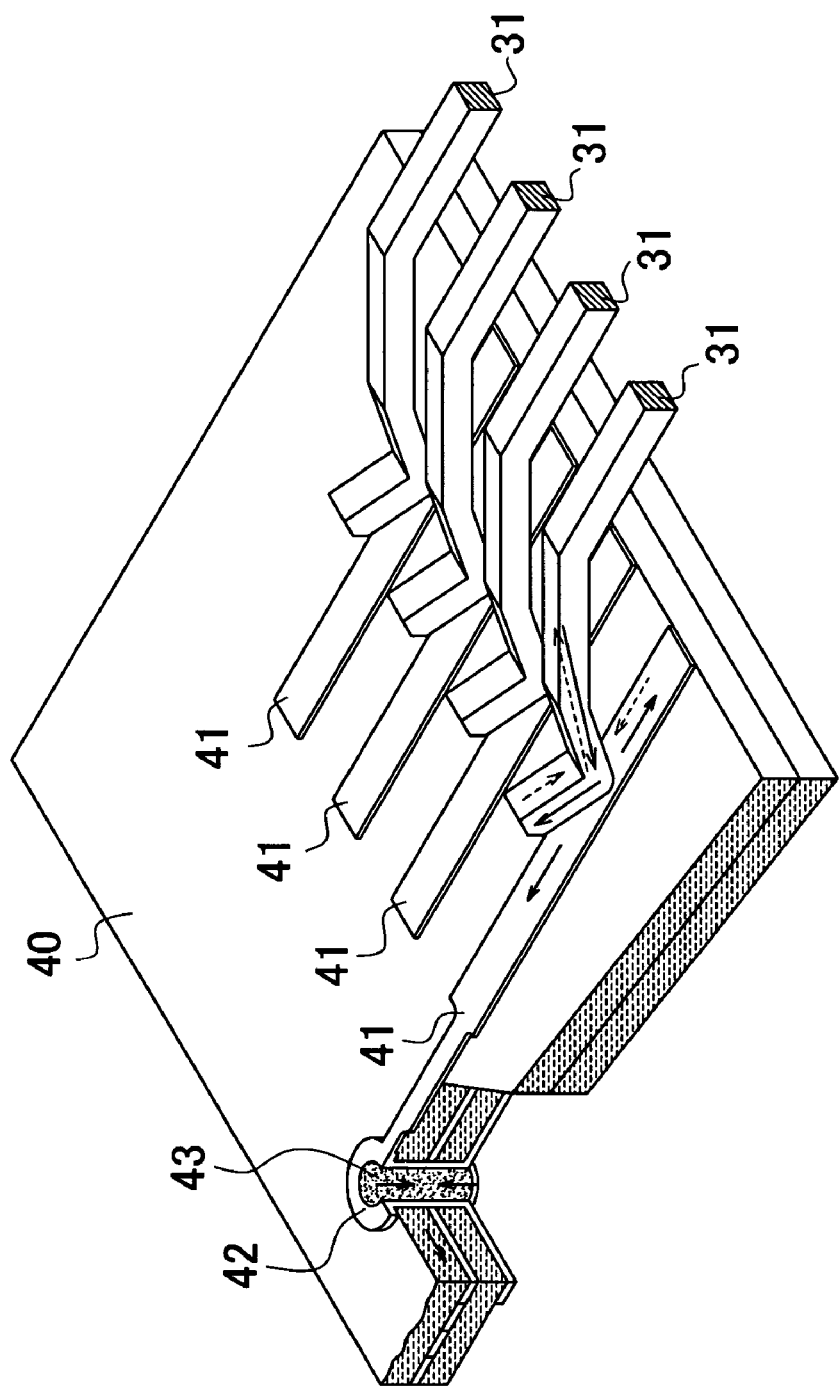
FIG. 12 is a perspective view showing a state in which external connecting terminals are connected to a multilayer printed circuit board according to conventional technology.

FIG. 11 is a perspective outline view of the first high speed transmission line board 1 produced according to the abovementioned process. In FIG. 11, the first high speed transmission lines 1C are differential signal lines forming pairs, and a gap S between the widths W of each differential signal is set in advance by the process shown in FIG. 7. Furthermore, in the etching process, the width W of each differential signal may be a pattern width narrower than the width of the first elastomer strips 1B.

Moreover, in FIG. 11, a desired pitch PY of the first elastomer strips 1B, that form the edge connectors connected to the external connecting terminals, can be obtained by suitably setting the various board thicknesses of the anisotropic conductive blocks 17, the dielectric elastomer sheets 18, and the conductive elastomer sheets 19, shown in FIG. 9.

The invention claimed is:

1. A connecting sheet comprising a multilayer board constructed of plural boards that are laminated, a pair of external connecting terminals being in pressurized contact with two edges of the multilayer board, the multilayer board comprising:
   a first high speed transmission line board having a stripline structure, that comprises
   a first elastomer sheet that has a fixed dielectric constant;
   plural first elastomer strips arrayed at two edges of the first elastomer sheet, that are electrically conductive between front and back surfaces; and
   plural first high speed transmission lines connecting two ends of the plural first elastomer strips and being formed in a pattern on the first elastomer sheet; and
   a first surface layer board that comprises
   a second elastomer sheet that is nonconductive, and
   plural second elastomer strips arrayed in association with the plural first elastomer strips, at edges of the second elastomer sheet, being electrically conductive between front and back surfaces.

2. The connecting sheet according to claim 1, wherein the multilayer board is configured by the first surface layer board being laminated on the first high speed transmission line board, the plural second elastomer strips being arrayed in association with the first elastomer strips, at two edges of the second elastomer sheet, on the first surface layer board, the external connecting terminals being in pressurized contact with the plural second elastomer strips formed at two edges of the first surface layer board, and the external connecting terminals and the plural first high speed transmission lines being connected.

3. The connecting sheet according to claim 1, wherein the multilayer board further comprises:
   a second surface layer board that comprises a third elastomer sheet that is nonconductive, and
   plural third elastomer strips arrayed in association with the plural first elastomer strips, at one edge of the third elastomer sheet, being conductive between front and back surfaces;
   the multilayer board is configured with the first high speed transmission line board as a core board, and the first surface layer board and the second surface layer board are laminated opposing each other;
   on the first surface layer board the second elastomer strips are arrayed in association with the first elastomer strips, at one edge of the second elastomer sheet;
   the second elastomer strips and the third elastomer strips are positioned at two edges of the multilayer board; one of one pair of external connecting terminals is in pressurized contact with the plural second elastomer strips formed at one edge of the first surface layer board;
   the other of the external connecting terminals is in pressurized contact with the plural third elastomer strips formed at the other edge of the second surface layer board; and
   the external connecting terminals and the plural first high speed transmission lines are connected.

4. The connecting sheet according to claim 3, wherein the first multilayer board further comprises a first inner layer board and a first and a second ground board;
   the first high speed board further comprises a first elastomer forming plural ground layers, arrayed in parallel to the first high speed transmission lines so as to sandwich the first high speed transmission lines, being electrically conductive between front and back surfaces;
   the first inner layer board comprises a fourth elastomer sheet that is nonconductive, plural fourth elastomer strips arrayed in association with the first elastomer strips at two edges of the fourth elastomer sheet and being electrically conductive between front and back surfaces, and a second elastomer forming plural ground layers arrayed in association with the first elastomer, being electrically conductive between front and back surfaces;
   the first and the second ground boards have at least a width in contact with the first elastomer;
   the first ground board, the first high speed transmission line board, the first inner layer board, and the second ground board are laminated, in that order, to form an offset stripline structure;
   on two surfaces of the offset stripline structure the first surface layer board and the second surface layer board are additionally laminated to form the multilayer board; and
   by the surfaces of the multilayer board being pressed together, an electromagnetic shielding wall is formed between the plural first high speed transmission lines.

5. The connecting sheet according to claim 4, wherein the electromagnetic shielding wall between the plural first high speed transmission lines is formed by respectively joining, with electrically conductive adhesive, the first ground board and the first elastomer on the first high speed transmission line board, the first elastomer and the second elastomer on the first inner layer board, and the second elastomer and the second ground board.

6. The connecting sheet according to claim 1, wherein the multilayer board further comprises a second surface layer board, a first inner layer board, and a first and a second ground board;
   on the first surface layer board the plural second elastomer strips are arrayed in association with the first elastomer strips, at two edges of the second elastomer sheet;
   the second surface layer board comprises a third elastomer sheet that is nonconductive, and plural third elastomer strips arrayed in association with the first elastomer strips, at edges of the third elastomer sheet, that are electrically conductive between front and back surfaces;
   the first high speed transmission line board further comprises a first elastomer that forms plural ground layers, arrayed in parallel to the first high speed transmission lines so as to sandwich the first high speed transmission lines, that are electrically conductive between front and back surfaces;
   the first inner layer board comprises a fourth elastomer sheet that is nonconductive, plural fourth elastomer strips arrayed in association with the first elastomer strips, at two edges of the fourth elastomer sheet, being electrically conductive between front and back surfaces, and a second elastomer forming plural ground layers, arrayed in association with the first elastomer, being electrically conductive between front and back surfaces;

the ground boards have at least a width in contact with the first elastomer;

the first ground board, the first high speed transmission line board, the first inner layer board, and the second ground board are laminated, in that order, to form an offset stripline structure;

the first surface layer board is additionally laminated on the offset stripline structure to form the multilayer board; and by the surfaces of the multilayer board being pressed together, an electromagnetic shielding wall is formed between the plural first high speed transmission lines.

7. The connecting sheet according to claim 6, wherein the electromagnetic shielding wall between the plural first high speed transmission lines is formed by respectively joining, with electrically conductive adhesive, the first ground board and the first elastomer on the first high speed transmission line board, the first elastomer and the second elastomer on the first inner layer board, and the second elastomer and the ground boards.

8. The connecting sheet according to claim 7, wherein the multilayer board further includes a second high speed transmission line board having a stripline structure, a second inner layer board, and a third ground board;

first elastomer strip pairs formed of two of the first elastomer strips on the first high speed transmission line board are arrayed at regular intervals at two edges of the first elastomer sheet, the first high speed transmission lines are connected at regular intervals alternately with the first elastomer strip pairs, between two ends of the first elastomer strips;

the third elastomer strips of the second surface layer board are arrayed in association with the first elastomer strips, at one edge of the third elastomer sheet;

the second high speed transmission line board comprises a fifth elastomer sheet that has a fixed dielectric constant, plural fifth elastomer strips arrayed at intervals overlapping the first elastomer strips, at two edges of the fifth elastomer sheet, and being electrically conductive between front and back surfaces, plural second high speed transmission lines formed in a pattern on the fifth elastomer sheet and connecting two ends of the plural fifth elastomer strips so as to alternate with the plural first high speed transmission lines, and a third elastomer forming plural ground layers, arrayed in parallel to the second high speed transmission lines so as to sandwich the second high speed transmission lines, being electrically conductive between front and back surfaces;

the second inner layer board comprises a sixth elastomer sheet that is nonconductive, plural sixth elastomer strips arrayed in association with the fifth elastomer strips, at two edges of the sixth elastomer sheet, that are electrically conductive between front and back surfaces, and a fourth elastomer forming plural ground layers arrayed in association with the third elastomer, that is electrically conductive between front and back surfaces;

the second surface layer board, the third ground board, the second high speed transmission line board, the second inner layer board, the first ground board, the first high speed transmission line board, the first inner layer board, the second ground board, and the first surface layer board are laminated, in that order, to form the multilayer board having a two-layer offset stripline structure;

the external connecting terminals are in pressurized contact with the plural second elastomer strips formed at two edges of the first surface layer board in the multilayer board, and the external connecting terminals are connected with the plural first high speed transmission lines and the plural second high speed transmission lines.

9. The connecting sheet according to claim 6, wherein the multilayer board further includes a second high speed transmission line board having a stripline structure, a second inner layer board, and a third ground board;

first elastomer strip pairs formed of two of the first elastomer strips on the first high speed transmission line board are arrayed at regular intervals at two edges of the first elastomer sheet, the first high speed transmission lines are connected at regular intervals alternately with the first elastomer strip pairs, between two ends of the first elastomer strips;

the third elastomer strips of the second surface layer board are arrayed in association with the first elastomer strips, at one edge of the third elastomer sheet;

the second high speed transmission line board comprises a fifth elastomer sheet that has a fixed dielectric constant, plural fifth elastomer strips arrayed at intervals overlapping the first elastomer strips, at two edges of the fifth elastomer sheet, and being electrically conductive between front and back surfaces, plural second high speed transmission lines formed in a pattern on the fifth elastomer sheet and connecting two ends of the plural fifth elastomer strips so as to alternate with the plural first high speed transmission lines, and a third elastomer forming plural ground layers, arrayed in parallel to the second high speed transmission lines so as to sandwich the second high speed transmission lines, being electrically conductive between front and back surfaces;

the second inner layer board comprises a sixth elastomer sheet that is nonconductive, plural sixth elastomer strips arrayed in association with the fifth elastomer strips, at two edges of the sixth elastomer sheet, that are electrically conductive between front and back surfaces, and a fourth elastomer forming plural ground layers arrayed in association with the third elastomer, that is electrically conductive between front and back surfaces;

the second surface layer board, the third ground board, the second high speed transmission line board, the second inner layer board, the first ground board, the first high speed transmission line board, the first inner layer board, the second ground board, and the first surface layer board are laminated, in that order, to form the multilayer board having a two-layer offset stripline structure;

the external connecting terminals are in pressurized contact with the plural second elastomer strips formed at two edges of the first surface layer board in the multilayer board, and the external connecting terminals are connected with the plural first high speed transmission lines and the plural second high speed transmission lines.

10. The connecting sheet according to claim 9, wherein one of the pair of external connecting terminals is in pressurized contact with the plural second elastomer strips formed at one edge of the first surface layer board in the multilayer board, the other of the external connecting terminals is in pressurized contact with the plural third elastomer strips formed at the other edge of the second surface layer board in the multilayer board, and the external connecting terminals are connected with the plural first high speed transmission lines and the plural second high speed transmission lines.

11. The connecting sheet according to claim 10, wherein the electromagnetic shielding wall between the plural second high speed transmission lines is formed by respectively joining, with electrically conductive adhesive, the third ground board and the third elastomer on the second high speed transmission line board, the third elastomer and the fourth elastomer on the second inner layer board, and the fourth elastomer and first ground board.

12. The connecting sheet according to claim 9, wherein the electromagnetic shielding wall between the plural second high speed transmission lines is formed by respectively joining, with electrically conductive adhesive, the third ground board and the third elastomer on the second high speed transmission line board, the third elastomer and the fourth elastomer on the second inner layer board, and the fourth elastomer and first ground board.

13. The connecting sheet according to claim 1, wherein the multilayer board further comprises: a second high speed transmission line board having a stripline structure, a first inner layer board, a second inner layer board, a third inner layer board, first, second, third, and fourth ground boards, and a bottom sheet;

- the first high speed transmission line board further comprises a first elastomer forming plural ground layers arrayed in parallel to the first high speed transmission lines so as to sandwich the first high speed transmission lines, that are conductive between front and back surfaces;
- the first high speed transmission lines connect, as desired, two ends of the first elastomer strips;
- on the first surface layer board the second elastomer strips are arrayed in association with the first elastomer strips, at two edges of the second elastomer sheet;
- the second high speed transmission line board comprises a fifth elastomer sheet that has a fixed dielectric constant, plural fifth elastomer strips arrayed at two edges of the fifth elastomer sheet, that are conductive between front and back surfaces, plural second high speed transmission lines connecting, as desired, two ends of the plural fifth elastomer strips, and formed in a pattern on the fifth elastomer sheet, and a second elastomer forming plural ground layers arrayed in parallel to the second high speed transmission lines so as to sandwich the second high speed transmission lines, being conductive between front and back surfaces;
- the first inner layer board comprises a fourth elastomer sheet that is nonconductive, plural fourth elastomer strips arrayed in association with the first elastomers strips, at two edges of the fourth elastomer sheet, that are conductive between front and back surfaces, and a third elastomer forming plural ground layers arrayed in association with the first elastomer, that are conductive between front and back surfaces;
- the second inner layer board comprises a sixth elastomer sheet that is nonconductive, plural sixth elastomer strips arrayed in association with the first elastomer strips at two edges of the sixth elastomer sheet, being conductive between front and back surfaces, and a fourth elastomer forming plural ground layers arrayed in association with the first elastomer, being conductive between front and back surfaces;
- the third inner layer board comprises a seventh elastomer 1 that is nonconductive, and plural seventh elastomer strips arrayed in association with the fifth elastomer strips, at two edges of the seventh elastomer sheet, being conductive between front and back surfaces;
- the first, second, third, and fourth ground boards have at least a width in contact with the first elastomer and the second elastomer;
- the bottom sheet, the fourth ground board, the second high speed transmission line board, the third inner layer board, the third ground board, the second inner layer board, the first ground board, the first high speed transmission line board, the first inner layer board, the second ground board, and the first surface layer board are laminated, in that order, to form the multilayer board that has a two-layer offset stripline structure; and
- the plural first high speed transmission lines and the plural second high speed transmission lines intersect three dimensionally in the multilayer board.

14. The connecting sheet according to claim 13, wherein the external connecting terminals are in pressurized contact with the plural second elastomer strips formed at two edges of the first surface layer board in the multilayer board, and the external connecting terminals are connected to the plural first high speed transmission lines and the plural second high speed transmission lines.

15. The connecting sheet according to claim 1, wherein the high speed transmission lines include differential signal lines that form a pair.

* * * * *